(12) United States Patent
Islam et al.

(10) Patent No.: US 12,176,423 B2
(45) Date of Patent: Dec. 24, 2024

(54) FINFET POWER SEMICONDUCTOR DEVICES

(71) Applicant: Wolfspeed, Inc., Durham, NC (US)

(72) Inventors: Naeem Islam, Morrisville, NC (US); Woongsun Kim, Cary, NC (US); Daniel Jenner Lichtenwalner, Raleigh, NC (US); Sei-Hyung Ryu, Cary, NC (US)

(73) Assignee: Wolfspeed, Inc., Durham, NC (US)

( * ) Notice: Subject to any disclaimer, the term of this patent is extended or adjusted under 35 U.S.C. 154(b) by 144 days.

(21) Appl. No.: 17/108,505

(22) Filed: Dec. 1, 2020

(65) Prior Publication Data

US 2022/0173227 A1 Jun. 2, 2022

(51) Int. Cl.
*H01L 29/66* (2006.01)
*H01L 29/06* (2006.01)
(Continued)

(52) U.S. Cl.
CPC .... *H01L 29/66803* (2013.01); *H01L 29/0623* (2013.01); *H01L 29/086* (2013.01); *H01L 29/7825* (2013.01); *H01L 29/7851* (2013.01)

(58) Field of Classification Search
CPC ......... H01L 29/66674–66681; H01L 29/7816; H01L 29/7835; H01L 29/7801; H01L 29/66795; H01L 29/785–7851; H01L 29/41791; H01L 29/0623; H01L 29/086; H01L 29/0619; H01L 29/0878; H01L 29/7802; H01L 29/7827–7828; H01L 29/78642; H01L 29/66712; H01L 29/1608; H01L 29/66053; H01L 29/66068; H01L 21/0445–0495; H01L 21/02378;

(Continued)

(56) References Cited

U.S. PATENT DOCUMENTS 6,380,569 B1 4/2002 Chang et al.
2005/0082542 A1* 4/2005 Sumakeris .......... H01L 29/8083
438/105

(Continued)

FOREIGN PATENT DOCUMENTS

JP 2003517725 A 5/2003
JP 2005236267 A 9/2005

(Continued)

OTHER PUBLICATIONS

Notification of Transmittal of the International Search Report and the Written Opinion of the International Searching Authority, or the Declaration, in corresponding PCT Application No. PCT/US2021/060699 (May 19, 2022).

(Continued)

*Primary Examiner* — Jaehwan Oh
(74) *Attorney, Agent, or Firm* — Myers Bigel, P.A.

(57) ABSTRACT

A power semiconductor device includes a semiconductor layer structure comprising a wide bandgap semiconductor material. The semiconductor layer structure includes a drift region of a first conductivity type and a plurality of fin structures protruding from the drift region. The fin structures comprise respective source regions of the first conductivity type and respective channel regions between the respective source regions and the drift region. Related devices and methods are also discussed.

26 Claims, 16 Drawing Sheets

(51) Int. Cl.
    *H01L 29/08*    (2006.01)
    *H01L 29/78*    (2006.01)

(58) Field of Classification Search
    CPC ..... H01L 21/823487; H01L 21/823431; H01L 21/823821; H01L 27/0886; H01L 27/1211; H01L 27/0924; H01L 27/2454
    See application file for complete search history.

(56) References Cited

U.S. PATENT DOCUMENTS

| | | | |
|---|---|---|---|
| 2012/0161208 A1* | 6/2012 | Veliadis | H01L 29/2003 257/E21.445 |
| 2016/0027880 A1* | 1/2016 | Zeng | H01L 29/407 257/330 |
| 2017/0069727 A1* | 3/2017 | Blanchard | H01L 29/42368 |
| 2020/0111903 A1* | 4/2020 | Joo | H01L 29/4236 |
| 2021/0013314 A1* | 1/2021 | Hu | H01L 29/24 |
| 2021/0328052 A1* | 10/2021 | Huang | H01L 29/7812 |

FOREIGN PATENT DOCUMENTS

| | | | | |
|---|---|---|---|---|
| JP | 2012227324 A | 11/2012 | | |
| JP | 2015065453 A | 4/2015 | | |
| JP | 2019096711 A | 6/2019 | | |
| WO | 2014178262 A1 | 11/2014 | | |
| WO | WO-2019191465 A9 * | 10/2019 | ............. | C30B 29/16 |

OTHER PUBLICATIONS

Wang et al. "Switching Performance Evaluation of 1200 V Vertical GaN Power FinFETs" 2019 IEEE 7th Workshop on Wide Bandgap Power Devices and Applications (WiPDA) (Oct. 2019).

Xiao et al. "Vertical GaN Superjunction FinFet: A Novel Device Enabling Multi-Kilovolt and Megahertz Power Switching" 2019 Device Research Conference (DRC) (Jun. 2019).

Zhou et al. "A Novel Kilovolts GaN Vertical Superjunction MOSFET with Trench Gate: Approach for Device Design and Optimization" IEEE Journal of Emerging and Selected Topics in Power Electronics 7(3):1440-1448 (Sep. 2019).

* cited by examiner

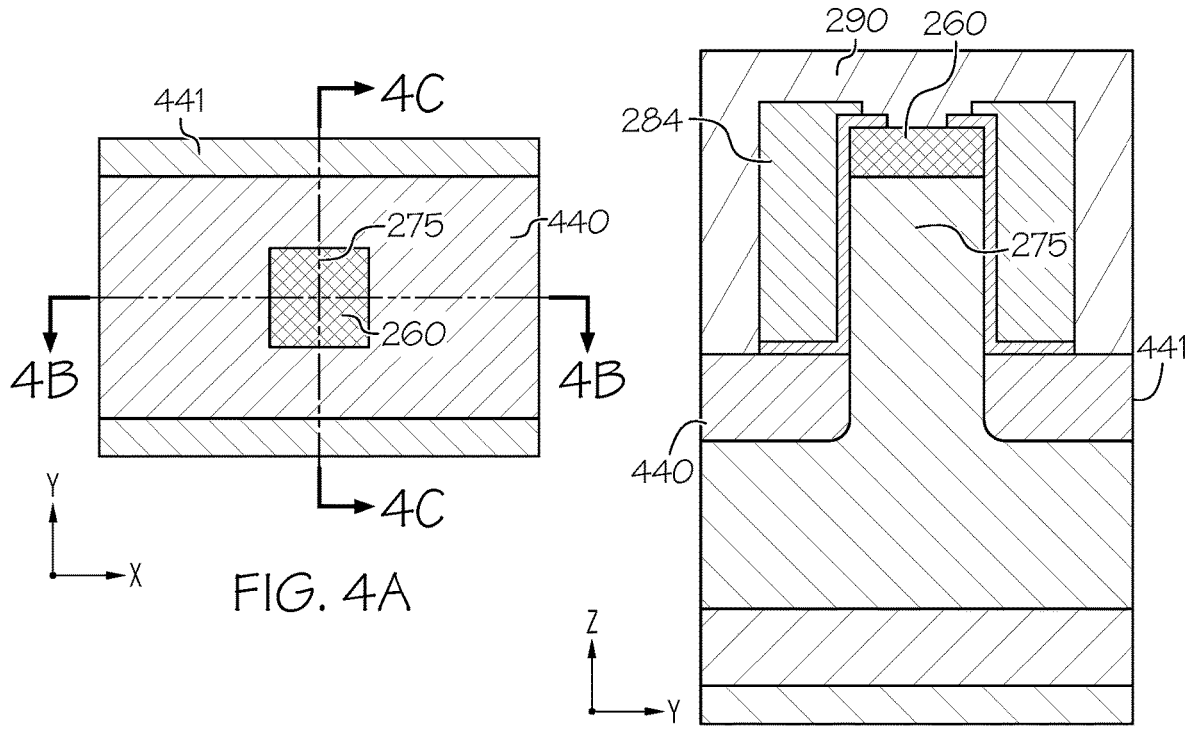
FIG. 4A
FIG. 4C
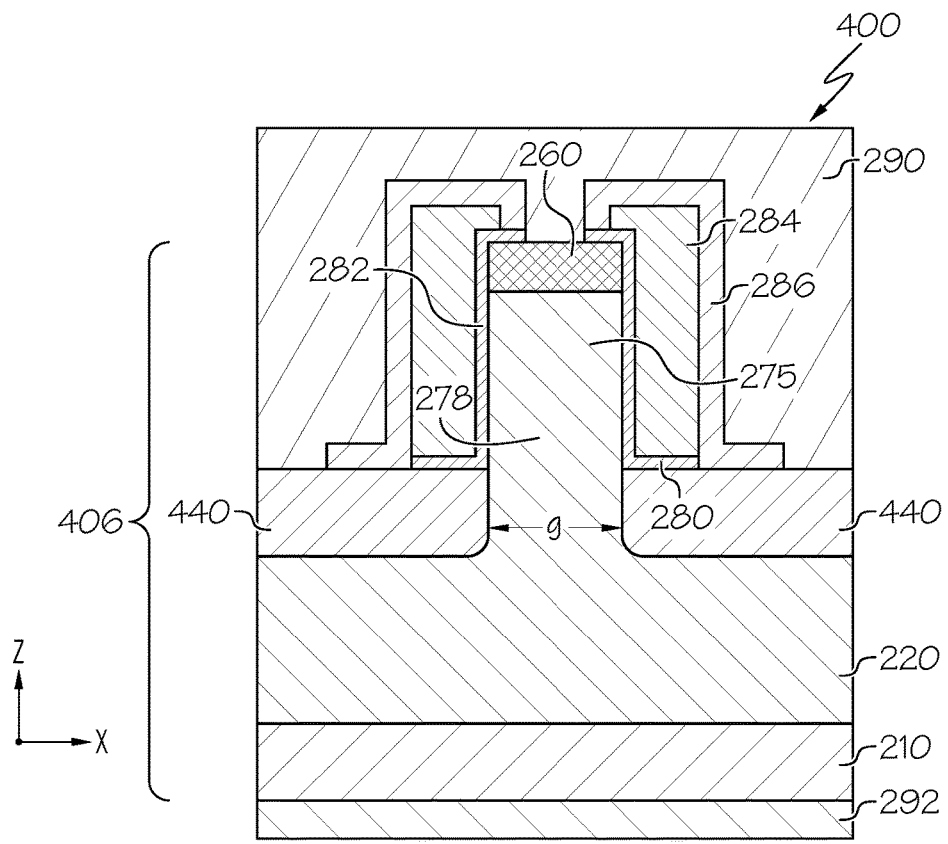
FIG. 4B

FINFET POWER SEMICONDUCTOR DEVICES

FIELD

The present invention relates to semiconductor devices and, more particularly, to power semiconductor devices.

BACKGROUND

Power semiconductor devices are used to carry large currents and support high voltages. A wide variety of power semiconductor devices are known in the art including, for example, power Metal Insulator Semiconductor Field Effect Transistors ("MISFETs", including Metal Oxide Semiconductor FETs ("MOSFETs")), bipolar junction transistors ("BJTs"), Insulated Gate Bipolar Transistors ("IGBT"), Junction Barrier Schottky diodes, Gate Turn-Off Transistors ("GTO"), MOS-controlled thyristors, and various other devices. These power semiconductor devices are generally fabricated from wide bandgap semiconductor materials, for example, silicon carbide ("SiC") or Group III nitride (e.g., gallium nitride ("GaN"))-based semiconductor materials. Herein, a wide bandgap semiconductor material refers to a semiconductor material having a bandgap greater than about 1.40 eV, for example, greater than about 2 eV.

A conventional power semiconductor device typically has a semiconductor substrate having a first conductivity type (e.g., a n-type substrate) on which an epitaxial layer structure having the first conductivity type (e.g., n-type) is formed. A portion of this epitaxial layer structure (which may comprise one or more separate layers) functions as a drift layer or drift region of the power semiconductor device. The device typically includes an "active region," which includes one or more "unit cell" structures that have a junction, for example, a p-n junction. The active region may be formed on and/or in the drift region. The active region acts as a main junction for blocking voltage in the reverse bias direction and providing current flow in the forward bias direction. The power semiconductor device may also have an edge termination in a termination region that is adjacent the active region. One or more power semiconductor devices may be formed on the substrate, and each power semiconductor device will typically have its own edge termination. After the substrate is fully processed, the resultant structure may be diced to separate the individual edge-terminated power semiconductor devices.

Power semiconductor devices may have a unit cell configuration in which a large number of individual unit cell structures of the active region are electrically connected in parallel to function as a single power semiconductor device. In high power applications, such a power semiconductor device may include thousands or tens of thousands of unit cells implemented in a single chip or "die." A die or chip may include a small block of semiconducting material or other substrate in which electronic circuit elements are fabricated.

Power semiconductor devices can have a lateral structure or a vertical structure. In a device having a lateral structure, the terminals of the device (e.g., the drain, gate and source terminals for a power MOSFET device) are on the same major surface (e.g., top or bottom) of a semiconductor layer structure. In contrast, in a device having a vertical structure, at least one terminal is provided on each major surface of the semiconductor layer structure (e.g., in a vertical MOSFET device, the source may be on the top surface of the semiconductor layer structure and the drain may be on the bottom surface of the semiconductor layer structure). The semiconductor layer structure may or may not include an underlying substrate. Herein, the term "semiconductor layer structure" refers to a structure that includes one or more layers, for example, semiconductor substrates and/or semiconductor epitaxial layers.

Power semiconductor devices are designed to block (in the forward or reverse blocking state) or pass (in the forward operating state) large voltages and/or currents. For example, in the blocking state, a power semiconductor device may be designed to sustain hundreds or thousands of volts of electric potential. As the applied voltage approaches or passes the voltage level that the device is designed to block, non-trivial levels of current (referred to as leakage current) may begin to flow through the power semiconductor device. The blocking capability of the device may be a function of, among other things, the doping density/concentration and thickness of the drift region. Leakage currents may also arise for other reasons, such as failure of the edge termination and/or the primary junction of the device. If the voltage applied to the device is increased past the breakdown voltage to a critical level, the increasing electric field may result in an uncontrollable and undesirable runaway generation of charge carriers within the semiconductor device, leading to a condition known as avalanche breakdown.

SUMMARY

According to some embodiments, a power semiconductor device includes a semiconductor layer structure comprising a wide bandgap semiconductor material. The semiconductor layer structure includes a drift region of a first conductivity type and a plurality of fin structures protruding from the drift region. The fin structures include respective source regions of the first conductivity type and respective channel regions between the respective source regions and the drift region.

In some embodiments, the drift region may include a first dopant concentration, and the respective channel regions may include a second dopant concentration that is less than the first dopant concentration.

In some embodiments, the respective source regions may include a third dopant concentration that is greater than the first and second dopant concentrations.

In some embodiments, the respective channel regions may include regions of the first conductivity type having the second dopant concentration.

In some embodiments, the respective channel regions may include well regions of a second conductivity type having the second dopant concentration.

In some embodiments, shielding regions of a second conductivity type may be provided in portions of the drift region between the fin structures and a substrate of the semiconductor layer structure.

In some embodiments, respective boundaries of the shielding regions may be substantially aligned with respective sidewalls of the fin structures.

In some embodiments, the respective channel regions may be first channel regions, and second channel regions may be provided between the shielding regions and a surface of the drift region from which the fin structures protrude.

In some embodiments, respective buried regions of the first conductivity type may be provided in portions of the drift region between the shielding regions. The respective buried regions may include a higher dopant concentration than the drift region.

In some embodiments, the shielding regions may laterally extend between adjacent ones of the fin structures.

In some embodiments, the shielding regions may be connected to an electrical ground between the adjacent ones of the fin structures.

In some embodiments, respective boundaries of the shielding regions may be offset from respective sidewalls of the fin structures.

In some embodiments, respective trenches may extend into the drift region between the fin structures. The respective trenches may be offset from respective sidewalls of the fin structures, and the shielding regions may extend along floor surfaces of the respective trenches.

In some embodiments, the shielding regions may include a semiconductor material that is different than the wide bandgap semiconductor material. In some embodiments, the wide bandgap semiconductor material may be silicon carbide, and the shielding regions may be polysilicon.

In some embodiments, the shielding regions on opposite sides of a respective one of the fin structures may be asymmetric.

In some embodiments, the respective channel regions may have the first conductivity type and may be free of p-n junctions therein.

In some embodiments, the fin structures may be separated from one another along a first direction. The fin structures may have respective widths of about 2 micrometers ($\mu$m) or less in the first direction.

In some embodiments, gate structures may be provided on at least one sidewall of the fin structures, respectively. The respective channel regions may be configured to conduct electrical current between the respective source regions and the drift region throughout a majority of respective volumes of the fin structures responsive to a voltage applied to the gate structures.

In some embodiments, the fin structures may protrude from a surface of the semiconductor layer structure, and the fin structures may be separated from one another along first and second directions along the surface.

According to some embodiments, a power semiconductor device includes a semiconductor layer structure comprising a wide bandgap semiconductor material. The semiconductor layer structure includes a drift region of a first conductivity type and a plurality of fin structures protruding from the drift region. The fin structures include respective source regions of the first conductivity type and respective channel regions between the respective source regions and the drift region. Gate structures are provided on at least one sidewall of the fin structures, respectively. The respective channel regions are configured to conduct electrical current between the respective source regions and the drift region throughout a majority of respective volumes of the fin structures responsive to a voltage applied to the gate structures.

In some embodiments, the respective channel regions may be configured to conduct the electrical current throughout substantially an entirety of the respective volumes of the fin structures.

In some embodiments, the respective channel regions may have the first conductivity type and may be free of p-n junctions therein.

In some embodiments, the respective channel regions may include well regions of a second conductivity type.

In some embodiments, the drift region may include a first dopant concentration, and the respective channel regions may include a second dopant concentration that is less than the first dopant concentration.

In some embodiments, the respective source regions may include a third dopant concentration that is greater than the first and second dopant concentrations.

In some embodiments, shielding regions of a second conductivity type may be provided in portions of the drift region between the fin structures and a substrate of the semiconductor layer structure.

In some embodiments, the respective channel regions may be first channel regions, and second channel regions may be provided between the shielding regions and a surface of the drift region from which the fin structures protrude.

In some embodiments, respective boundaries of the shielding regions may be substantially aligned with or offset from respective sidewalls of the fin structures.

According to some embodiments, a power semiconductor device includes a semiconductor layer structure comprising a wide bandgap semiconductor material. The semiconductor layer structure includes a drift region of a first conductivity type and a plurality of fin structures protruding from a surface of the semiconductor layer structure. The fin structures include respective source regions of the first conductivity type and respective channel regions between the respective source regions and the drift region. The fin structures are separated from one another along first and second directions along the surface.

In some embodiments, gate structures may be provided on at least one sidewall of the fin structures, respectively. The respective channel regions may be configured to conduct electrical current between the respective source regions and the drift region throughout a majority of respective volumes of the fin structures responsive to a voltage applied to the gate structures.

In some embodiments, the first direction may be substantially perpendicular to the second direction. The fin structures may have respective widths along the first direction and respective lengths along the second direction.

In some embodiments, the respective widths may be about 2 micrometers ($\mu$m) or less along the first direction.

In some embodiments, the drift region may include a first dopant concentration, and the respective channel regions may include a second dopant concentration that is less than the first dopant concentration.

In some embodiments, the respective channel regions may have the first conductivity type and may be free of p-n junctions therein.

In some embodiments, the respective channel regions may include well regions of a second conductivity type.

In some embodiments, shielding regions of a second conductivity type may be provided in portions of the drift region below the fin structures.

In some embodiments, respective boundaries of the shielding regions may be substantially aligned with or offset from respective sidewalls of the fin structures.

Other devices, apparatus, and/or methods according to some embodiments will become apparent to one with skill in the art upon review of the following drawings and detailed description. It is intended that all such additional embodiments, in addition to any and all combinations of the above embodiments, be included within this description, be within the scope of the invention, and be protected by the accompanying claims.

BRIEF DESCRIPTION OF THE DRAWINGS

FIG. 4A is a plan view illustrating a unit cell structure of a power semiconductor device including shielding regions in accordance with some embodiments of the present invention. FIGS. 4B and 4C are cross-sectional views taken along lines B-B' and C-C' of FIG. 4A, respectively.

DETAILED DESCRIPTION OF EMBODIMENTS

Vertical power semiconductor devices that include a MOSFET transistor may be implemented using several different wide bandgap semiconductor structures. For example, a planar MOSFET structure may include a standard gate electrode design in which the gate electrode of the transistor is formed on top of the semiconductor layer structure. A trench MOSFET structure may include the gate electrode buried in a trench within the semiconductor layer structure, and may also be referred to as a gate trench MOSFET. These vertical power semiconductor device structures utilize a p-n junction barrier and the inversion of a doped well region to provide electron flow from source to drain in a vertical direction. Although described and illustrated herein with reference to regions of specific conductivity types (i.e., n-type and p-type) by way of example, it will be understood that the conductivity types of the regions in any of the illustrated examples may be reversed (i.e., p-type and n-type) in accordance with embodiments of the present invention.

Figure 1A:
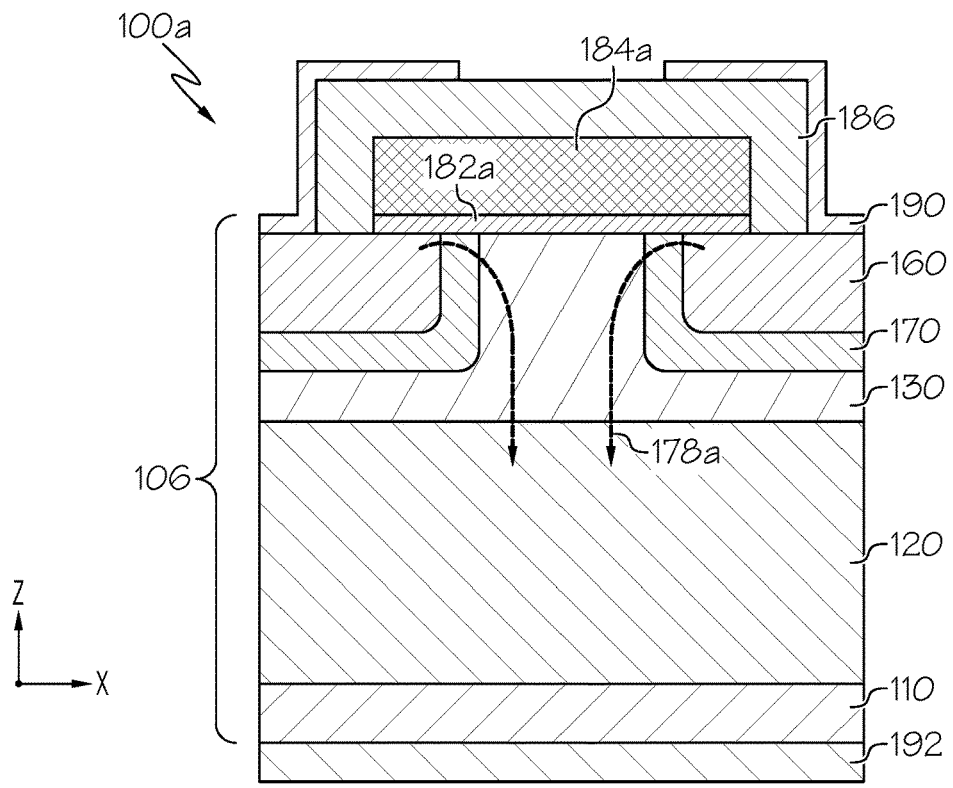
FIG. 1A is a schematic cross-sectional view illustrating an example of a vertical power semiconductor device having a planar transistor structure.
Figure 1B:
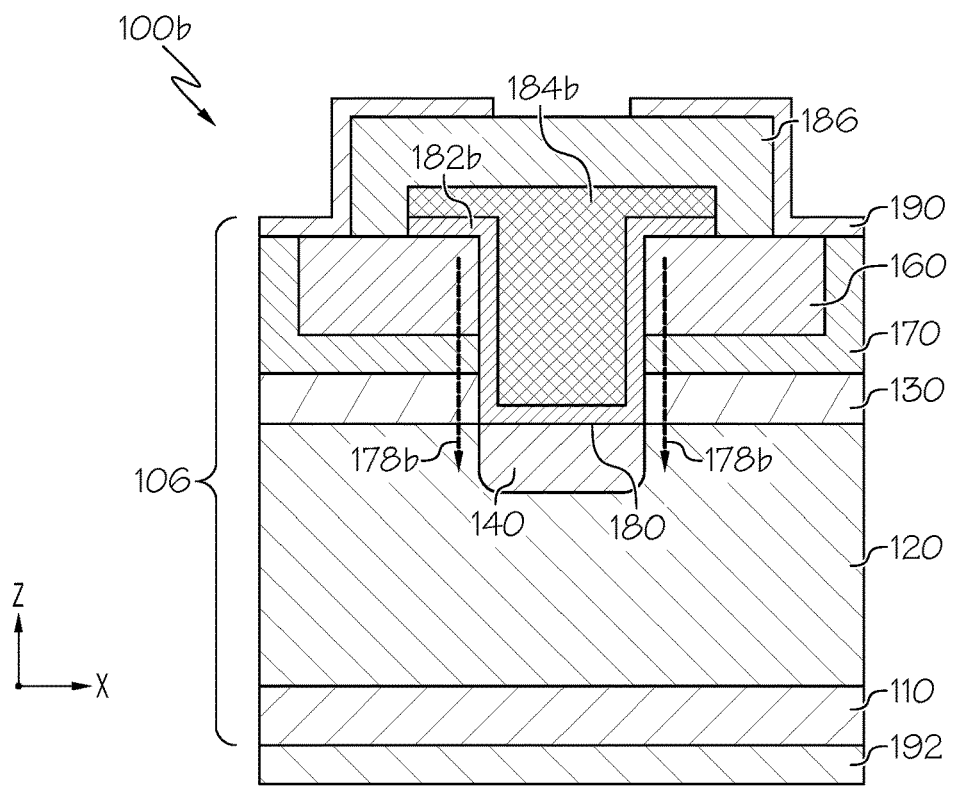
FIG. 1B is a schematic cross-sectional view illustrating an example of a vertical power semiconductor device having a trench structure.

FIGS. 1A and 1B are schematic cross-sectional views illustrating examples of vertical power semiconductor devices, illustrated as a unit cell of a planar MOSFET 100a and a trench MOSFET 100b, respectively. As shown in FIGS. 1A and 1B, the power MOSFETs 100a, 100b each include a heavily-doped (e.g., n$^+$) n-type substrate 110, e.g., a silicon carbide substrate. A lightly-doped (e.g., n$^-$) n-type drift layer or region 120 is provided on the substrate 110, for example by epitaxial growth. In some embodiments, a portion of the n-type drift region 120 may include a n-type current spreading layer ("CSL") 130 having a higher doping or dopant concentration than the drift region 120. A moderately-doped p-type layer is formed (for example, by epitaxial growth or implantation) on the drift region 120 and acts as the well regions (or "P-wells") 170 for the devices 100a, 100b. Heavily-doped n$^+$ source regions 160 are formed in upper portions of the well regions 170, for example, via ion implantation. The substrate 110, drift region 120 (including current spreading layer 130), the moderately doped p-type layer defining the well regions 170, and the source regions 160, along with various regions/patterns formed therein, are included in a semiconductor layer structure 106. A gate insulating layer, for example oxide layer 182a, 182b (collectively 182), is formed on portions of the drift region 120, the well regions 170, and the source regions 160. A gate electrode (or "gate") 184a, 184b (collectively 184) is formed on the gate oxide layer 182.

More particularly, in the planar MOSFET 100a of FIG. 1A, the gate oxide layer 182a is formed on portions of the drift region 120, the well regions 170, and the source regions 160 adjacent a surface of the semiconductor layer structure 106, and the gate 184a is formed on the gate oxide layer 182a extending along the surface of the structure 106. A transistor channel region 178a for each planar MOSFET 100a unit cell (with conduction shown by dashed arrows) is defined through the wells 170 and the portions of the drift region 120 underneath the gate 184a. For example, the inversion channel 178a of planar SiC MOSFET may be on the Si-face of SiC.

In the trench MOSFET 100b of FIG. 1B, a gate trench 180 is formed extending from the surface of the semiconductor layer structure 106 into the drift region 120, the gate oxide layer 182a is formed on sidewalls and a bottom surface of the gate trench 180, and the gate 184b is formed on the gate oxide layer 182a to fill the trench 180. Transistor channel regions 178b for each trench MOSFET 100b unit cell (with conduction shown by dashed arrows) are defined vertically through the wells 170 along sidewalls of the gate trench 180. For example, the inversion channel 178b of a trench SiC MOSFET may be along the sidewalls of the trench, on the a-face or the m-face of SiC.

The trench MOSFET 100b of FIG. 1B further includes a deep shielding pattern 140 underneath the gate trench 180 in order to reduce the electric field levels in the gate insulating layer 182b, particularly at corners of the gate trenches 180 where the electric field levels may be more concentrated. The deep shielding pattern 140 includes highly doped semiconductor layers having the same conductivity type (in this example, p-type) as the well regions 170, but a greater dopant concentration.

Forming regions of varying doping characteristics may pose challenges when trenched vertical power devices are fabricated in silicon carbide or other wide bandgap semiconductor materials. Methods for doping a semiconductor material with n-type and/or p-type dopants include (1) doping the semiconductor material during the growth thereof, (2) diffusing the dopants into the semiconductor material, and (3) using ion implantation to selectively implant the dopants in the semiconductor material. However, when silicon carbide is doped during epitaxial growth, the dopants tend to unevenly accumulate, and hence the dopant concentration may vary (for example, by ±15%), which can negatively affect device operation and/or reliability. Additionally, doping by diffusion may be difficult in silicon carbide, gallium nitride and various wide bandgap semiconductor devices, since n-type and p-type dopants tend to not diffuse well (or at all) in these materials, even at high temperatures. Embodiments are primarily described herein with reference to ion implantation to form regions of varying doping characteristics, but it will be understood that embodiments of the present invention are not so limited.

Still referring to FIGS. 1A and 1B, an intermetal dielectric (IMD) layer 186 may be formed on the gate 184, and source contacts 190 may be formed on the source regions 160. The source contacts 190 may be ohmic metal in some embodiments. A drain contact 192 is formed on the lower surface of the substrate 110. A gate contact (not shown) may be formed on each gate electrode 184.

In the MOSFETS 100a and 100b of FIGS. 1A and 1B, the channel regions 178a and 178b may be defined by forming the drift region 120 of a first conductivity type (e.g., n-type), forming well regions 170 of a different/opposite second conductivity type (e.g., p-type) in or on the drift region 120, and forming source regions 160 of the first conductivity type on the well regions 170. The well regions 170 and/or source regions 160 may be formed by ion implantation or epitaxial growth on the drift region 120, and on-state operation of the MOSFETs 100a, 100b rely on the inversion of the well regions 170.

Some SiC-based vertical power semiconductor devices, such as the planar and trench MOSFETs 100a and 100b of FIGS. 1A and 1B, may inherently have lower specific on-resistance, particularly in implementations with a relatively narrow unit cell pitch as achieved by forming the channels on the sidewalls of the gate trenches. Moreover, the channel mobility on the gate trench sidewall in trench MOSFETs (e.g., along the a-face or m-face of SiC) may be about 2-4 times higher than that in planar MOSFETs (e.g., along the Si-face of SiC), which may result in an enhanced current density. However, as noted above, the on-state operation of some conventional trench MOSFETs may utilize a relatively narrow localized carrier density in the inverted channel (e.g., in the portions of the P-well adjacent to the gate in case of an n-MOSFET) for drain-to-source electrical current conduction.

Embodiments of the present invention are directed to vertical power semiconductor devices, such as MOSFETs, IGBTs, and related power semiconductor devices, which can achieve higher channel carrier densities and lower channel specific on-resistances as compared to some traditional planar and/or trench power semiconductor devices. In particular, carrier density can be increased by achieving a volumetric carrier distribution in the channel region, in some embodiments using mesa- or fin-shaped semiconductor structures (generally referred to herein as fin structures) defining on-state conduction regions having dimensions that are configured to conduct electrical current throughout a majority of (or up to substantially an entirety of) their respective volumes (also referred to herein as volumetric current flow or conduction). For example, the fin structures may have width dimensions (e.g., along a direction of separation between adjacent fin structures) of less than about 1 micrometer, e.g., less than about 500 nanometers. Additionally or alternatively, the fin structures may be separated from one another in two directions (e.g., in width and length directions along the surface of a semiconductor layer structure), defining island-shaped fin structures, for example, in an array. In some embodiments, the fin structures may define junction-less channel regions. As used herein, a junction-less channel region can be switched between on-(conducting) and off-(non-conducting) states by control of the channel region responsive to an applied voltage, without the presence of a p-n junction or forming an inversion layer channel. For example, the dopant concentration of the junction-less channel region may be insufficient for conduction in the absence of an applied electric field, but may allow for electron accumulation and conduction responsive to an applied electric field.

Semiconductor structures in embodiments of the present invention may thereby improve channel carrier density, and thus reduce the channel specific on-resistance in a power semiconductor device. The reduced conduction and switching losses can allow devices to invert responsive to high frequency, low to moderate voltage (e.g., about 650 V to about 1200 V) power applications, with reduced requirements of passive components. That is, with higher frequency and lower resistance and losses achieved, other circuit elements (e.g., capacitors and/or inductors (for use in matching networks or otherwise), heat sinks, etc.) can be simplified. Embodiments of the present invention may thus provide reduced weight, lower cost, and simple or lower-complexity cooling effort. Also, as the fin-structures are dimensioned to provide volumetric current flow (and in some embodiments are free of opposite conductivity type well regions), the number of fin-structures per unit area of the device may be increased, thereby improving the overall conduction per area or footprint of the power semiconductor device as compared to some prior devices.

Thus, embodiments of the present invention may provide power semiconductor devices including layouts and design arrangements utilizing on-state conduction regions providing volumetric carrier distribution that reduces the specific on-resistance, in some embodiments with junction-less on-state operation (e.g., with channel regions that are free of p-n junctions). Further embodiments described herein provide shielding regions and/or related implant approaches that can allow process flexibility.

Figure 2A:
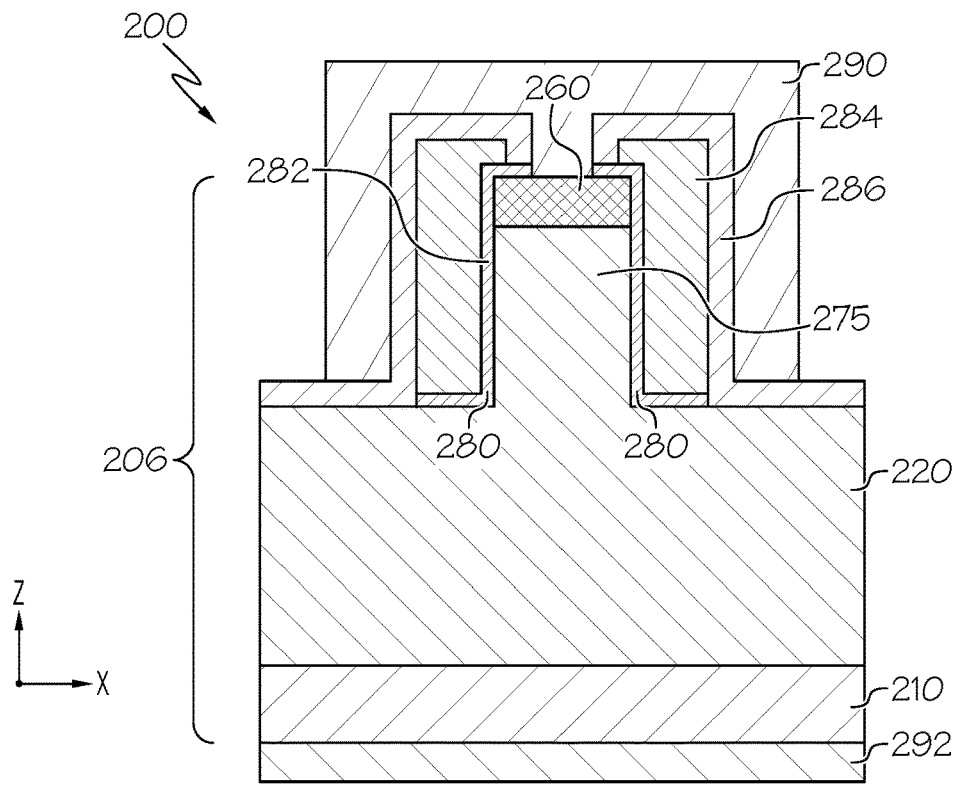
FIGS. 2A, 2B, and 2C are cross-sectional views illustrating unit cell structures of power semiconductor devices in accordance with some embodiments of the present invention.
Figure 2B:
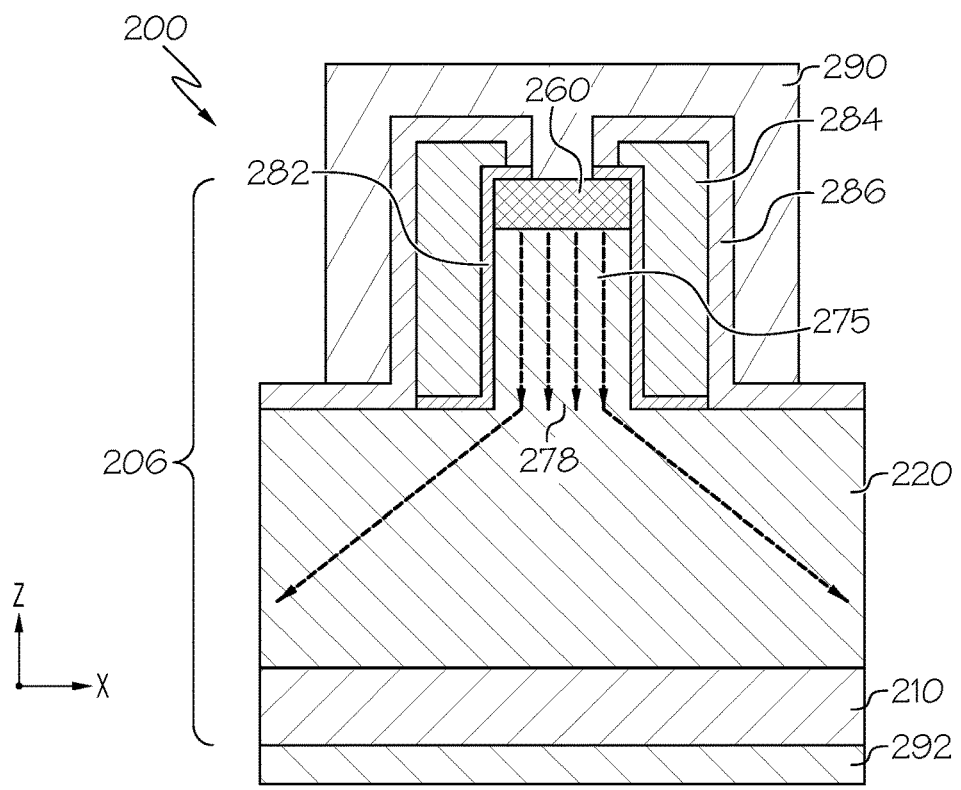

FIGS. 2A and 2B are cross-sectional views illustrating a unit cell structure of a power semiconductor device in accordance with some embodiments of the present invention. In particular, FIG. 2A illustrates an example junction-less structure for a power semiconductor device, while FIG. 2B illustrates electron flow in the example structure of FIG. 2A. As noted, the conductivity types of the regions in any of the illustrated examples may be reversed (i.e., p-type and n-type) in accordance with embodiments of the present invention.

As shown in FIGS. 2A and 2B, an example vertical power semiconductor device, illustrated as a unit cell of a power MOSFET 200 (also referred to herein as a finFET), includes a substrate 210 of a first conductivity type (e.g., n-type) formed from a wide bandgap semiconductor material, for example, silicon carbide. The substrate 210 may define a drain region for the device 200. A drift layer or region 220 of the first conductivity type is provided on the substrate 210, for example, by epitaxial growth. The drift region 220 may be doped with impurities of the first conductivity type (e.g., nitrogen (N) or phosphorous (P) for an n-type drift region), and may have a dopant concentration of about $5 \times 10^{14}$ to $5 \times 10^{17}$ atoms/cm$^3$, for example, about $5 \times 10^{15}$ to $5 \times 10^{16}$, about $8 \times 10^{15}$ to $2 \times 10^{16}$ atoms/cm$^3$, or about $9 \times 10^{15}$ to $1 \times 10^{16}$ atoms/cm$^3$.

A mesa- or fin-shaped structure 275 including a lightly-doped (e.g., n−) portion or region of the first conductivity type protrudes from the drift region 220. The fin structure 275 may be doped with dopants of the first conductivity type (e.g., n-type impurities), and may have a dopant concentration of about $1 \times 10^{14}$ to $8 \times 10^{16}$ atoms/cm$^3$, for example, about $5 \times 10^{14}$ to $5 \times 10^{16}$ atoms/cm$^3$, about $1 \times 10^{15}$ to $1 \times 10^{16}$ atoms/cm$^3$, or about $1 \times 10^{15}$ to $5 \times 10^{15}$ atoms/cm$^3$. The fin structure 275 defines a channel region or on-state conduction region 278 for the MOSFET 200. As such, the channel region 278 has a dopant concentration that is less than the dopant concentration of the drift region 220, e.g., by a factor of about 10 or more in some embodiments.

A heavily-doped (e.g., n+) source region 260 of the first conductivity type is formed in an upper part of fin structure 275, for example, via ion implantation. The source region 260 may be doped with n-type impurities, and may have a dopant concentration of about $5 \times 10^{18}$ to $5 \times 10^{21}$ atoms/cm$^3$, for example, about $8 \times 10^{18}$ to $1 \times 10^{21}$ atoms/cm$^3$, about $1 \times 10^{19}$ to $5 \times 10^{20}$ atoms/cm$^3$, or about $5 \times 10^{19}$ to $1 \times 10^{20}$ atoms/cm$^3$. That is, the source region 260 has a dopant concentration that is greater than the dopant concentration of the drift region 220, e.g., by a factor of about 10 or more in some embodiments. The source region 260 may extend to respective corners of the fin structure 275. That is, the source region 260 may continuously extend along a periphery of or between opposing edges of the fin structure 275 between adjacent gate trenches 280. The fin structure 275 thus includes the source region 260 of the first conductivity type and the channel region 278 extending vertically between the source region 260 and the drift region 220, such that the source region 260 is stacked on the channel region 278 opposite the drift region 220. The substrate 210, drift region 220, and the fin structure 275, along with various regions/patterns formed therein, are included in a semiconductor layer structure 206.

The mesa- or fin-shaped semiconductor structures 275 provide enhanced carrier density and specific on-resistance reduction. While not shown in FIGS. 2A and 2B, reverse operation shielding regions may also be provided. The semiconductor layer structure 206 can be grown epitaxially on the substrate 210. In the example MOSFET 200, the semiconductor layer structure 206 includes, but is not limited to: (i) the (e.g., n-type) epitaxial layer 220 to support a reverse blocking voltage when a (e.g., p-type) shielding region is realized (as shown for example in FIGS. 3 to 16), (ii) the lightly doped (e.g., n−) mesa or fin structure 275 defining the channel region 278, and (iii) the heavily doped (e.g., n+) source region 260 on the top portion of the channel region 278.

A trench etch process may be used to etch portions of the epitaxial layer/drift region 220 to define a plurality of gate trenches 280 therein. Narrow fin structures 275 may be defined between sidewalls of adjacent gate trenches 280, such that the fin structures 275 protrude from the drift region 220. The fin structures 275 may continuously extend along the surface of the semiconductor layer structure 206 (e.g., as shown by the stripe-shaped fins 275' shown in FIG. 13), or may discontinuously extend along the surface (e.g., as shown by pillar-shaped fins 275" in FIG. 14). A gate insulating layer 282 is formed on at least one sidewall of the fin structures 275 (illustrated in FIGS. 2A and 2B as along opposing sidewalls), and gate electrodes or gates 284 are formed along the at least one sidewall of the fin structures 275 with the gate insulating layer 282 therebetween. The gate insulating layer 282 and the gate 284 thereon may be collectively referred to herein as the gate structure. An intermetal dielectric (IMD) layer 286 may be formed on the gates 284 to expose a surface of the source regions 260, and source contacts 290 may be formed on the source regions 260. The source contacts 290 may be ohmic metal in some embodiments. A drain contact 292 may be formed on the lower surface of the substrate 210. A gate contact (not shown) may be formed on each gate electrode 284.

Transistor channel regions 278 for each trench MOSFET 200 unit cell (with conduction of electrical current/electron flow shown by dashed arrows in FIG. 2B) is defined vertically in the fin structures 275. For example, in embodiments where the MOSFET 200 is SiC-based, the channel 278 may be along the a-face or the m-face of SiC.

Some embodiments of the present invention can achieve volumetric carrier distribution in the fin structures 275. In particular, in FIGS. 2A and 2B, the widths of the fin structures 275 along a direction (e.g., the x-direction) in which the fin structures 275 are spaced apart from one another may be sufficiently narrow to allow for depletion of the lightly doped n-type channel region 278 in the fin structures 275 and to prevent electrical current conduction when no bias voltage is applied to the gate 284. In some embodiments, the fin structures 275 may have respective widths of about 35 nanometers (nm) to about 5 micrometers (µm), for example, about 50 nm to about 2 µm, or about 100 nm to about 1 µm. In some embodiments, the fin structures 275 may have respective widths of less than about 500 nm or widths of about 300 nm or less, for example, width of about 50 to 200 nm. As such, the MOSFET 200 of FIGS. 2A and 2B is in an "off"-state in the absence of an applied voltage to the gate 284. The fin structures 275 may also have respective heights (e.g., in the z-direction) of about 300 nm to about 3.5 µm, for example, heights of about 200 nm to about 3 µm, or about 500 nm to 1.5 µm.

The MOSFET 200 can be turned "on" by applying a sufficient voltage (beyond a threshold voltage) to the gate 284, which will result in electron accumulation along the interfaces between the gate insulating layer 282 and the semiconductor at the sidewalls of the fin structures 275, e.g., at the oxide-semiconductor interfaces, for conduction between the source region 260 and the drain 292. As shown in FIG. 2B, the application of a gate voltage beyond the threshold voltage creates a channel 278 for conduction of electrical current throughout a majority of (or up to substantially an entirety of) the respective volumes of the fin structures 275 under a bias voltage applied to the drain 292. That is, one or more dimensions and/or dopant concentrations of the fin structures 275 described herein may be configured to provide carrier distribution or current flow throughout a majority (e.g., more than 50 percent, more than 75 percent, or up to an entirety) of the volume of each fin structure 275. In some embodiments, the channel 278 defined in the fin structures 275 of the semiconductor layer structure 206 may be junction-less, that is, free of a p-n junction.

Figure 2C:
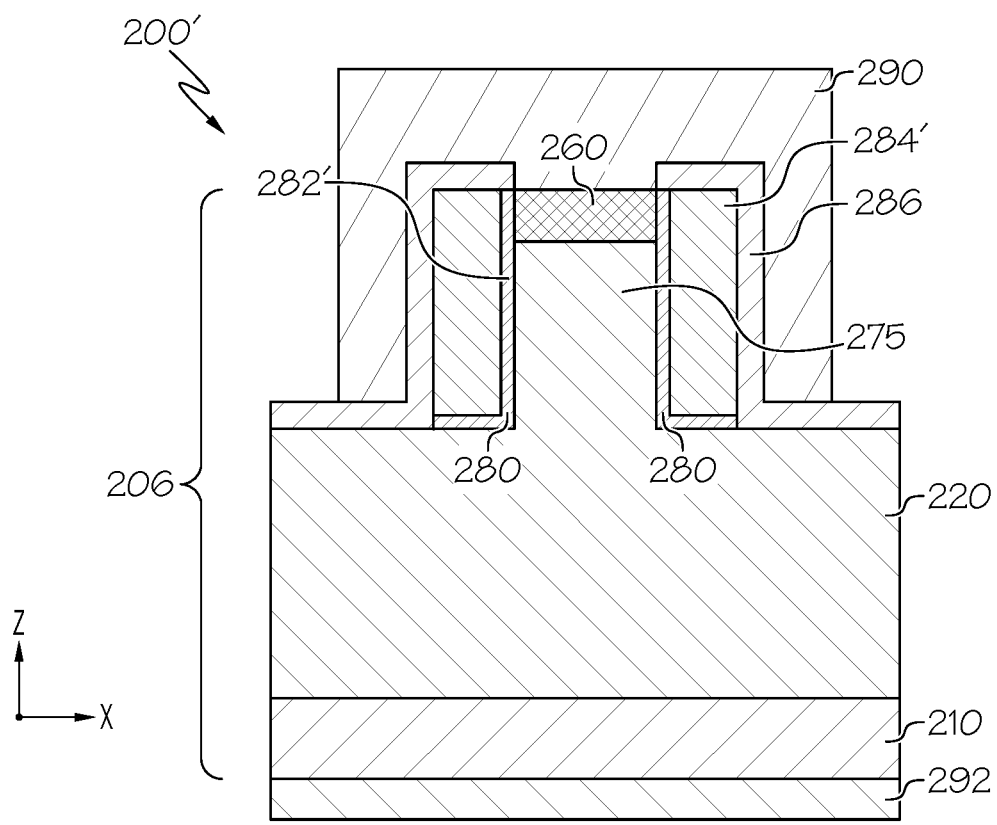

Although illustrated in FIGS. 2A and 2B as including the gate structure 282, 284 on the top surface and both sidewall surfaces of the fin structure 275, it will be understood that embodiments of the present invention are not limited to this configuration, and may include other configurations where a gate structure 282, 284 is provided on at least one sidewall of the fin structure 275. For example, in some embodiments, the fin structure 275 may be sufficiently narrow such that volumetric conduction may be achieved using a gate structure 282, 284 on only one sidewall of the fin structure 275. In some embodiments, gate structures 282', 284' may be provided on opposing sidewalls of the fin structure 275, and the top surface of the fin structure 275 may be free of the gate electrode 284' and/or gate insulating layer 282', as shown in FIG. 2C. The gates 284, 284' on opposing sidewalls of the fin structure 275 may be electrically connected in portions of the device 200' outside of the fin structure 275. That is, while primarily illustrated as including the gate structure 282, 284 extending on three surfaces of the fin structure 275, at least the top surface of the fin structure 275 may be free of the gates 284, with electrical connections of the gates 284 in device areas outside of the fin structures 275.

The example power MOSFET 200 illustrates basic principles of operation of some embodiments of the present invention, but embodiments described herein may include additional elements or regions beyond those shown in FIGS. 2A and 2B. For example, some embodiments may further include a current spreading layer CSL of the same conductivity type as (but having a higher dopant concentration than) the drift region 220 in portions of the drift region 220 under the mesas or fins 275. In addition, embodiments of the present invention may further include shielding regions for reverse voltage operation, as shown in the examples of FIGS. 3 to 16.

Figure 3A:
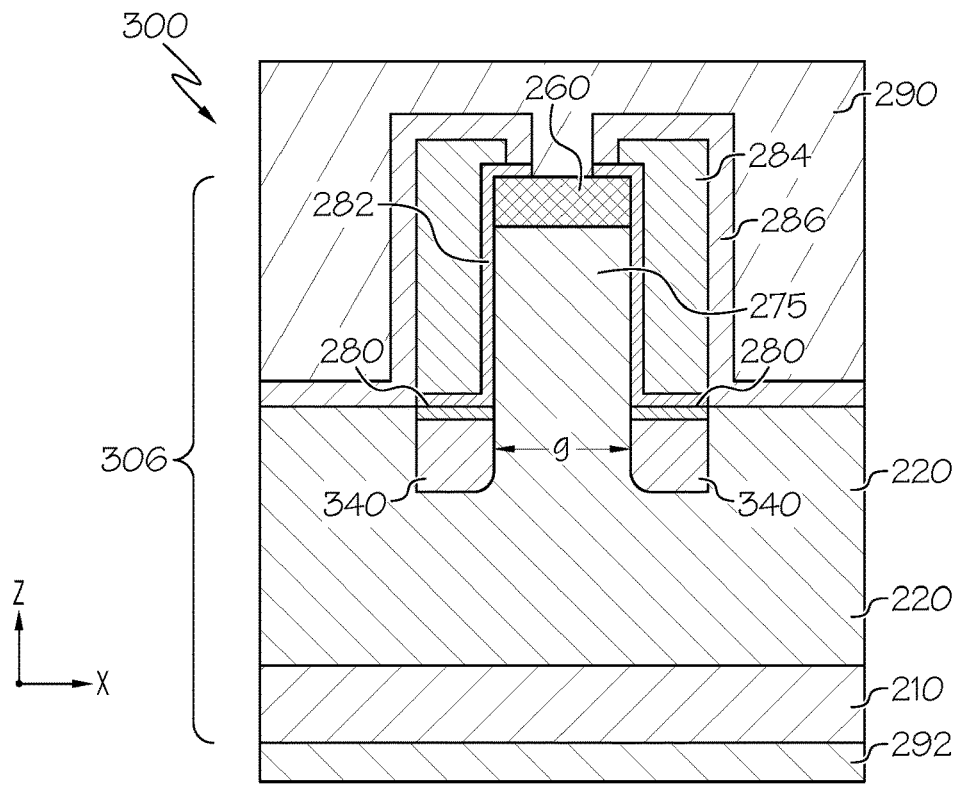
FIGS. 3A and 3B are cross-sectional views illustrating unit cell structures of power semiconductor devices including shielding regions and parallel channel regions in accordance with some embodiments of the present invention.
Figure 3B:
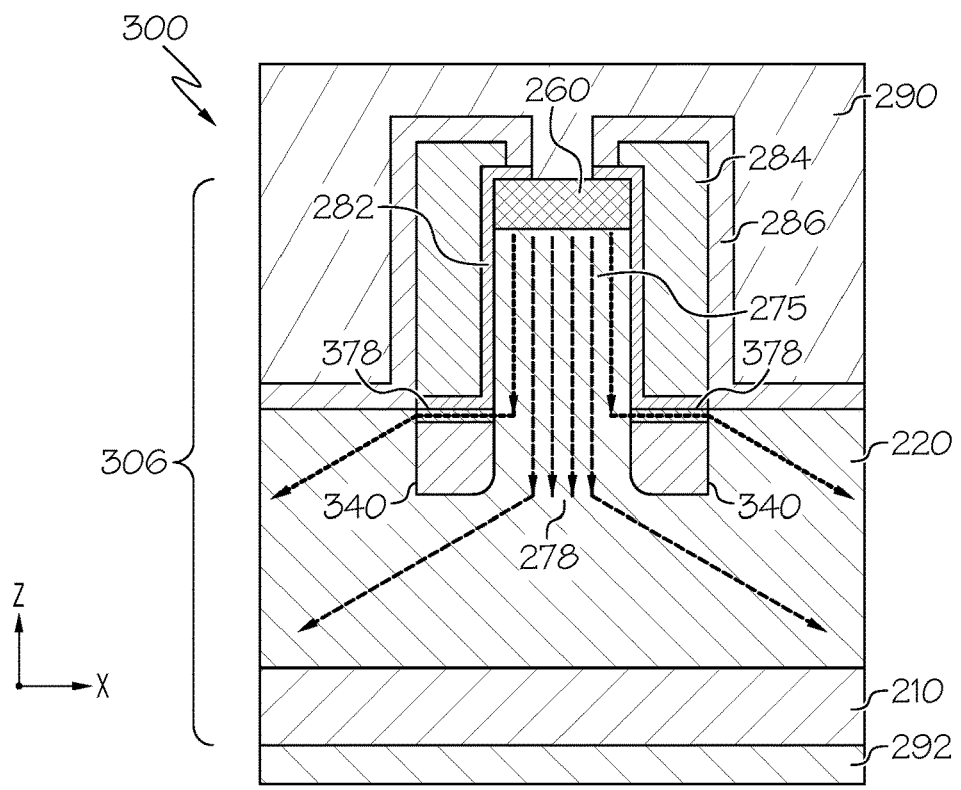

FIGS. 3A and 3B are cross-sectional views illustrating a unit cell structure of a power semiconductor device including shielding regions and parallel channel regions in accordance with some embodiments of the present invention. In particular, the example of FIG. 3A illustrates a finFET structure with shielding regions of the opposite conductivity type as the drift region, while the example of FIG. 3B illustrates electron flow in the structure of FIG. 3A, including a parallel channel for current conduction.

As shown in FIGS. 3A and 3B, an example vertical power semiconductor device, illustrated as a unit cell of a power MOSFET 300, includes a semiconductor layer structure 306. The semiconductor layer structure 306 includes one or more layers similar to the semiconductor layer structure 206. In particular, the semiconductor layer structure 306 includes a substrate 210 of a first conductivity type (e.g., n-type) formed from a wide bandgap semiconductor material, a drift region 220 of the first conductivity type (e.g., by epitaxial growth), and a mesa- or fin-shaped structure 275 including a lightly-doped (e.g., n$^-$) portion or region of the first conductivity type protruding from the drift region 220. The fin structure 275 includes a heavily-doped (e.g., n$^+$) source region 260 of the first conductivity type, and a channel region 278 between the source region 260 and the drift region 220, where the channel region 278 has a dopant concentration that is less than the dopant concentration of the drift region 220.

The semiconductor layer structure 306 further includes reverse operation shielding patterns or regions 340 of a second conductivity type (e.g., p-type) in the drift region 220. In particular, the finFET device 300 includes shielding regions 340 in portions of the drift region 220 underneath the gate trenches 280, outside of the fin structure 275. The shielding regions 340 are of the opposite conductivity type (e.g., p-type) than the drift region 220, and are configured to support a reverse blocking voltage, also referred to herein as providing reverse blocking capability. Shielding connection patterns (not shown) may be connected to the shielding regions 340 and the source contacts 290 (e.g., at the top of the device 300) to allow the shielding regions 340 to be electrically grounded.

The shielding regions 340 may be formed by an implantation process, for example, by implanting dopants of the second conductivity type (e.g., aluminum (Al) or boron (B) for p-type shielding regions) into bottom surfaces of the gate trenches 280 prior to forming the gate insulating layer 282 and the gate electrode 284. For example, the shielding regions described herein may be formed by implanting a p-type dopant with a concentration of between about $1\times10^{15}$ atoms/cm$^3$ and $1\times10^{20}$ atoms/cm$^3$, for example, $1\times10^{17}$ atoms/cm$^3$ or more. Boundaries of the shielding regions 340 may be aligned with sidewalls of the fin structure 275 and separated by a gap g corresponding to a width of the fin structure 275.

In some embodiments, the dopant concentration of the shielding regions may be substantially uniform. In some embodiments, the doping concentration of the shielding regions may be stepwise or continuously graded. For example, the dopant concentration of the second conductivity type dopants of the shielding regions 340 may increase along the depth (i.e., toward the substrate 210/in a direction away from the fin structures 275, e.g., in the z-direction), which may be provided for reverse blocking operation and oxide protection from field crowding under the trench.

The fin structure 275 includes one or more dimensions and/or doping (as discussed above with reference to FIGS. 2A and 2B) such that the channel body 278 is configured to be fully depleted at zero bias gate condition, thereby defining a normally "off"-type device 300. The MOSFET 300 can be turned "on" by applying a sufficient voltage (beyond a threshold voltage) to the gate 284, which will result in electron accumulation along the interfaces between the gate insulating layer 282 and the semiconductor material at the sidewalls of the fin structures 275. As shown in FIG. 3B, the application of a gate voltage beyond the threshold voltage creates a channel or on-state conduction region 278 for volumetric charge flow, that is, conduction of electrical current throughout a majority of (or up to substantially an entirety of) the volume of the fin structure 275 under a bias voltage applied to the drain 292. For example, the widths of the fin structures 275 along a direction in which the fin structures 275 are spaced apart from one another may be sufficiently narrow to allow for depletion of the lightly doped n-type channel region 278 when no bias voltage is applied to the gate 284, and to provide carrier distribution or current flow throughout a majority of the volume of the fin structure 278 responsive to application of a voltage beyond the threshold voltage to the gate 284.

In the example device 300 of FIGS. 3A and 3B, the semiconductor layer structure 306 does not include an opposite conductivity type (e.g., p−) doped well or channel region in the fin structure 275. That is, the fin structure 275 may be free of well regions of the opposite conductivity type than the drift region 220 (i.e., free of a p-n junction, or junction-less) in some embodiments, which may provide process- or fabrication-related advantages and may be free from random dopant related fluctuations. The dopant concentrations of the first conductivity type in the fin structure 275 may be significantly lower than in the drift region 220 (e.g., by a factor of about 10 or more), utilizing a volumetric majority carrier flow in the on-state which may help to achieve higher carrier mobility compared to some conventional trench MOSFETs.

Still referring to FIGS. 3A and 3B, interfaces between the gate insulating layer 282 at the bottom of the gate trenches 280 and the semiconductor at the top of the drift region 220 (e.g., oxide-semiconductor interfaces) may be relatively low doped regions of the second conductivity type, and can be utilized as a parallel conduction channel 378 under inversion responsive to voltage applied to the gate electrode(s) 284. That is, in some embodiments, the fin structures 275 may define first or primary channel regions 278, while the p-n junction between the shielding regions 340 and the drift region 220 may define second or secondary channel regions 378 (with conduction of electrical current/electron flow for both channels 278 and 378 shown by dashed arrows in FIG. 3B). In the example MOSFET 300, the fin structure 275 defining the first channel region 278 is free of a p-n junction, while a portion of the drift region 220 outside the fin structure 275 (e.g., adjacent the base of the fin structure 275) includes a p-n junction defining the second channel region 378.

FIG. 4A is a plan view illustrating a unit cell structure of a power semiconductor device including shielding regions in accordance with some embodiments of the present invention. FIGS. 4B and 4C are cross-sectional views taken along lines B-B' and C-C' of FIG. 4A, respectively. In comparison to FIGS. 3A and 3B, the example of FIGS. 4A-4C illustrate a finFET structure with wider shielding regions of the opposite conductivity type as the drift region, and without the parallel conduction channel.

As shown in FIGS. 4A-4C, an example vertical power semiconductor device, illustrated as a unit cell of a power MOSFET 400, includes a semiconductor layer structure 406. The semiconductor layer structure 406 includes one or more layers similar to the semiconductor layer structure 306. In particular, the semiconductor layer structure 406 includes a substrate 210 and a drift region 220 of a first conductivity type (e.g., n-type). A fin structure 275 protrudes from the drift region 220, and includes a higher dopant concentration (e.g., $n^+$) source region 260 and a lower dopant concentration (e.g., $n^-$) channel region 278 of the first conductivity type between the source region 260 and the drift region 220. The fin structure 275 includes one or more dimensions and/or doping concentrations such that the channel body 278 is configured to be fully depleted at zero bias gate condition (thereby defining a normally "off"-type device 400), and is configured to be turned "on" by applying a sufficient voltage (beyond a threshold voltage) to the gate 284, with conduction of electrical current throughout a majority of (or up to substantially an entirety of) the volume of the fin structure 275 under a bias voltage applied to the drain 292 (in this example without an opposite conductivity type well or channel region in the fin structure 275).

The semiconductor layer structure 406 further includes reverse operation shielding regions 440 of a second conductivity type (e.g., p-type) in the drift region 220. In particular, the finFET device 400 includes shielding regions 440 in portions of the drift region 220 underneath the gate trenches 280, outside of the fin structure 275 and extending between adjacent fin structures 275. The shielding regions 440 may be defined by an implantation process, with substantially uniform concentration or stepwise or continuous grading, as discussed above with reference to FIGS. 3A and 3B. Boundaries of the shielding regions 440 may be aligned with sidewalls of the fin structure 275 and separated by a gap g corresponding to a width of the fin 275. In contrast to the shielding regions 340 of FIGS. 3A and 3B, the shielding regions 440 continuously extend beyond the gate insulating layer 282 to contact the source contact 290. As such, the finFET device 400 does not include the parallel channel 378, and electrical contact between the source contact 290 and the shielding region 440 can be made within the unit cell as shown. Shielding connection patterns 441 may be provided at the top of the device 400 and may be electrically connected to the shielding regions 440 (e.g., by the source contacts 290) to allow the shielding regions 440 to be electrically grounded or connected to a low-side voltage. Also, while illustrated in FIG. 4A as continuously extending throughout the area of the unit cell, the shielding regions 440 may be selectively provided in portions of the unit cell, e.g., defining "stripes" in plan view. The shielding region 440 stripes may likewise be connected to the shielding connection patterns 441.

Figure 5:
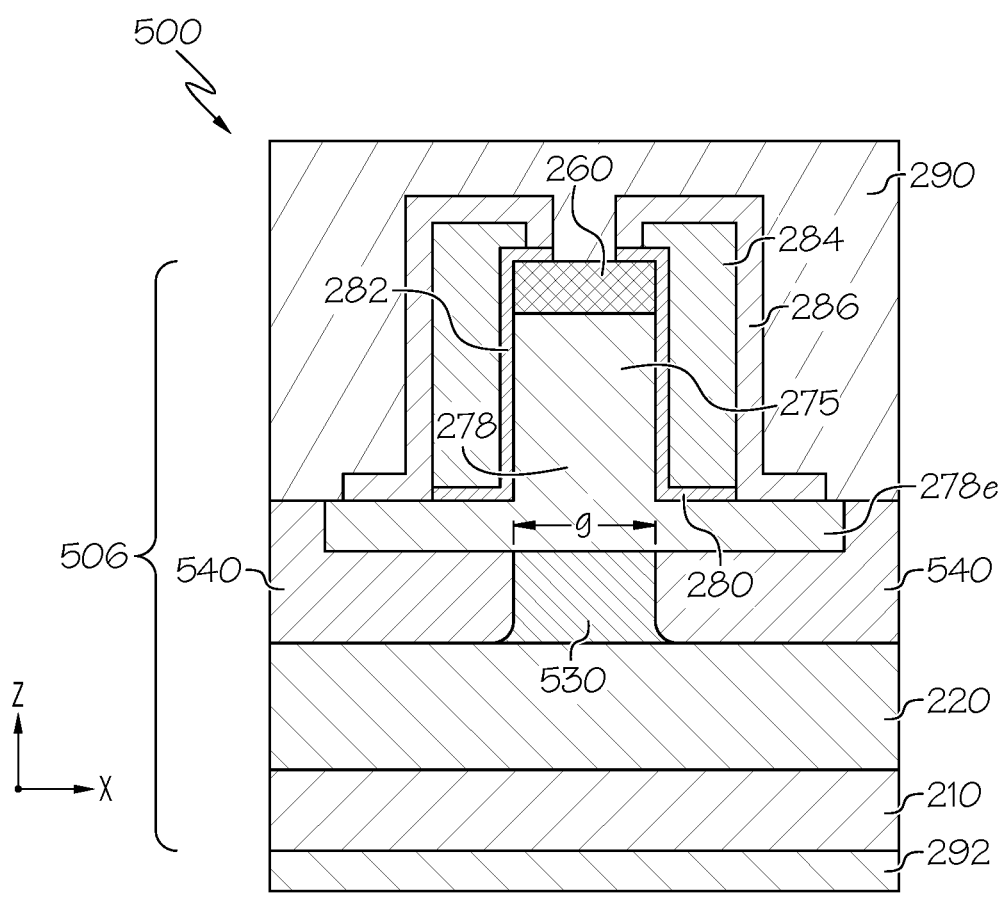
FIG. 5 is a cross-sectional view illustrating a unit cell structure of a power semiconductor device including shielding regions and heavily-doped JFET regions in accordance with some embodiments of the present invention.

FIG. 5 is a cross-sectional view illustrating a unit cell structure of a power semiconductor device including shielding regions and heavily-doped JFET regions in accordance with some embodiments of the present invention. In particular, FIG. 5 illustrates an example reverse operation protection implementation including a buried high dopant concentration region of the first conductivity type between the shielding regions of the second conductivity type, to reduce resistance in the upper portion of the drift region between adjacent gate trenches (also referred to herein as the "JFET region")

As shown in FIG. 5, an example vertical power semiconductor device, illustrated as a unit cell of a power MOSFET 500, includes a semiconductor layer structure 506. The semiconductor layer structure 506 includes one or more layers similar to the semiconductor layer structure 406. In particular, the semiconductor layer structure 506 includes a substrate 210 and a drift region 220 of a first conductivity type (e.g., n-type). A fin structure 275 protrudes from the drift region 220, and includes a higher dopant concentration (e.g., $n^{++}$) source region 260 and a lower dopant concentration (e.g., $n^-$) channel region 278 of the first conductivity type between the source region 260 and the drift region 220, with one or more dimensions and/or doping concentrations such that the channel body 278 is configured to conduct electrical current throughout a majority of (or up to substantially an entirety of) the volume of the fin structure 275 under a bias voltage applied to the drain 292 (in this example without an opposite conductivity type well or channel region in the fin structure 275).

The semiconductor layer structure 506 further includes reverse operation shielding regions 540 of a second conductivity type (e.g., p-type) in the drift region 220. In particular, the finFET device 500 includes shielding regions 540 in portions of the drift region 220 underneath the gate trenches 280, outside of the fin structure 275 and extending between adjacent fin structures 275. The shielding regions 540 may be defined by an implantation process, with substantially uniform concentration or stepwise or continuous grading, as discussed above. Boundaries of the shielding regions 540 may be aligned with sidewalls of the fin structure 275 and separated by a gap g, which in this example corresponds to a width of the fin 275. The shielding regions 540 continuously extend beyond the gate insulating layer 282 to contact the source contact 290 for connection to electrical ground within the unit cell, which may provide increased reliability and ruggedness.

In addition, optional channel extension regions 278e laterally extend (e.g., in the x-direction) under the gate 284 to define a wider channel region and/or further separate the gate 284 from the grounded shielding regions 540. The channel extension regions 278e likewise have a dopant concentration of the first conductivity type (e.g., n⁻) that is less than the dopant concentration of the drift region 220, and may be similar to the dopant concentration of the channel region 278.

In some embodiments (e.g., in the device 400 of FIGS. 4A-4C), the resistance in the upper portions of the drift region 220 between adjacent gate trenches 280 (i.e., the JFET region) can be increased due to the relatively narrow spatial difference between the shielding regions 540 under the gate trenches 280, shown by gap g. As such, in some embodiments as shown in FIG. 5, the MOSFET 500 further includes a higher dopant concentration (e.g., n⁺) buried region 530 of the first conductivity type in the JFET region, e.g., in the gap g between the shielding regions 540. The buried region 530 has a dopant concentration greater than the dopant concentration of the drift region 220 (e.g., by a factor of about 10 or more in some embodiments), which may reduce the parasitic resistance in the JFET region. The buried region 530 may be more heavily-doped (e.g., via ion implantation or during epitaxial growth) to provide the increased doping concentration. For example, the JFET region 530 may be doped with n-type impurities, and may have a dopant concentration of about $1 \times 10^{15}$ to $1 \times 10^{20}$ atoms/cm³, or about $1 \times 10^{16}$ to $2 \times 10^{18}$ atoms/cm³. In some embodiments, the JFET region 530 may have a dopant concentration less than the dopant concentration of the source region 260.

Figure 6:
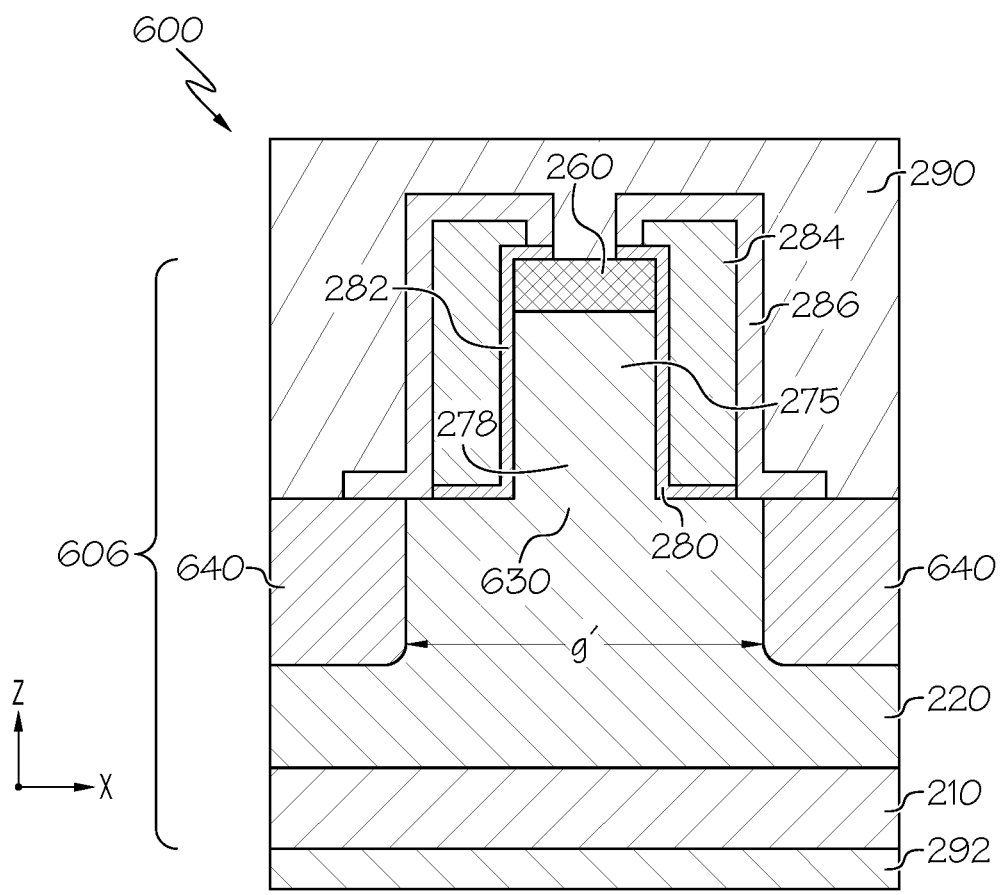
FIG. 6 is a cross-sectional view illustrating a unit cell structure of a power semiconductor device including offset shielding regions in accordance with some embodiments of the present invention.

FIG. 6 is a cross-sectional view illustrating a unit cell structure of a power semiconductor device including shielding regions in accordance with some embodiments of the present invention. In particular, FIG. 6 illustrates an example reverse operation protection implementation including shielding regions of the second conductivity type that are offset from edges of the gate trenches or sidewalls of the fin structures in order to reduce resistance in JFET region.

As shown in FIG. 6, an example vertical power semiconductor device, illustrated as a unit cell of a power MOSFET 600, includes a semiconductor layer structure 606. The semiconductor layer structure 606 includes one or more layers similar to the semiconductor layer structure 406. In particular, the semiconductor layer structure 506 includes a substrate 210 and a drift region 220 of a first conductivity type (e.g., n-type). A fin structure 275 protrudes from the drift region 220, and includes a higher dopant concentration (e.g., n⁺) source region 260 and a lower dopant concentration (e.g., n⁻) channel region 278 of the first conductivity type between the source region 260 and the drift region 220, with one or more dimensions and/or doping concentrations such that the channel body 278 is configured to conduct electrical current throughout a majority of (or up to substantially an entirety of) the volume of the fin structure 275 under a bias voltage applied to the drain 292 (in this example without an opposite conductivity type well or channel region in the fin structure 275).

The semiconductor layer structure 606 further includes reverse operation shielding regions 640 of a second conductivity type (e.g., p-type) in the drift region 220. In particular, the finFET device 600 includes shielding regions 640 in portions of the drift region 220 underneath the gate trenches 280, outside of the fin structure 275. Respective boundaries of the shielding regions 640 are offset from sidewalls of the fin structures 275 or edges of the gate trenches 280 between adjacent fin structures 275. The shielding regions 640 may be defined by an implantation process, with substantially uniform concentration or stepwise or continuous grading, and may extend beyond the gate insulating layer 282 to contact the source contact 290 for connection to electrical ground within the unit cell, as discussed above.

In the example of FIG. 6, the offset shielding regions 640 are separated by a gap g' that is greater than a width of the fin structure 275, thereby reducing the resistance in the JFET region 630 between the shielding regions 640. For example, the shielding regions 640 may be formed by an implantation process that is performed at an offset from the edges of the gate trenches 280 to increase the gap g' (and thus, increase the size of the JFET region 630) beyond the width of the fin 275. The increased gap g' may reduce the parasitic resistance in the JFET region 630, but may increase electric field crowding on the bottom portions of the gate insulating layer 282 at the base of the gate trenches 280. In some embodiments, the depth of the shielding regions 640 (relative to the substrate 210) and/or dopant concentrations of the shielding regions 640 may be increased as the gap g' is widened (i.e., as the amount of offset between the boundaries of the shielding regions 640 and the edges of the gate trenches 280 is increased). More generally, the gap g' between the offset shielding regions 640 may not correspond to the width or other dimension(s) of the fin structure 275.

Figure 7:
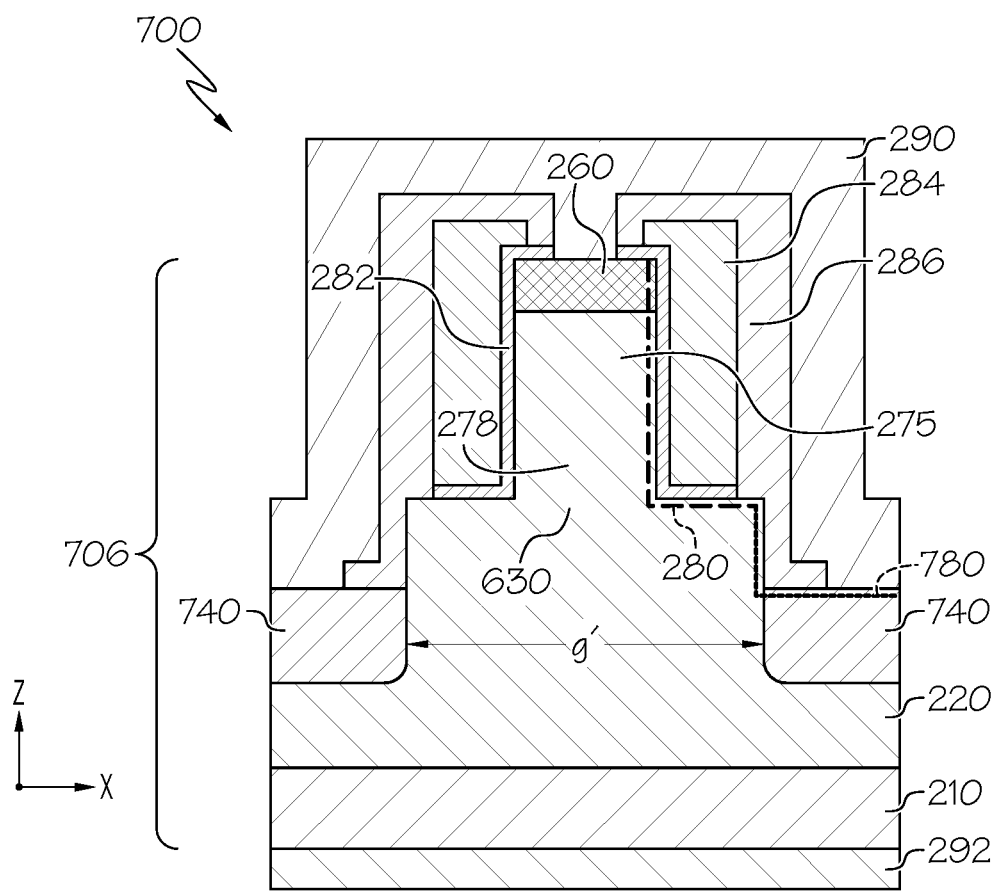
FIG. 7 is a cross-sectional view illustrating a unit cell structure of a power semiconductor device including offset shielding regions in deep trench regions in accordance with some embodiments of the present invention.

FIG. 7 is a cross-sectional view illustrating a unit cell structure of a power semiconductor device including offset shielding regions in accordance with some embodiments of the present invention. In particular, FIG. 7 illustrates an example reverse operation protection implementation including shielding regions of the second conductivity type that are both offset from edges of the gate trenches and provided in secondary trenches that extend deeper (with reference to the substrate) than the gate trenches.

As shown in FIG. 7, an example vertical power semiconductor device, illustrated as a unit cell of a power MOSFET 700, includes a semiconductor layer structure 706. The semiconductor layer structure 706 includes one or more layers similar to the semiconductor layer structure 606. In particular, the semiconductor layer structure 706 includes a substrate 210 and a drift region 220 of a first conductivity type (e.g., n-type). A fin structure 275 protrudes from the drift region 220, and includes a higher dopant concentration (e.g., n⁺) source region 260 and a lower dopant concentration (e.g., n⁻) channel region 278 of the first conductivity type between the source region 260 and the drift region 220, with one or more dimensions and/or doping concentrations such that the channel body 278 is configured to conduct electrical current throughout a majority of (or up to substantially an entirety of) the volume of the fin structure 275 under a bias voltage applied to the drain 292 (in this example without an opposite conductivity type well or channel region in the fin structure 275).

The semiconductor layer structure 706 further includes reverse operation shielding regions 740 of a second conductivity type (e.g., p-type) in the drift region 220, outside of the fin structure 275 and with boundaries offset from sidewalls of the fin structures 275/edges of the gate trenches 280 between adjacent fin structures 275. The offset shielding regions 740 are separated by a gap g' that is greater than a width of the fin structure 275. In particular, the finFET device 700 includes secondary trenches 780 (shown by dotted lines) in bottom or floor surfaces of the gate trenches 280 (shown by dashed lines). The secondary trenches 780 thus extend toward the substrate 210 to a greater depth than the gate trenches 280. The deeper secondary trenches 780 are offset from the sidewalls or edges of the shallower primary gate trenches 280, and the shielding regions 740 are provided in the drift region 220 underneath the secondary trenches 780. For example, the shielding regions 740 may be defined in floor surfaces of the secondary trenches 780 by an implantation process, with substantially uniform concentration or stepwise or continuous grading, as similarly discussed above. The shielding regions 740 may likewise extend beyond the gate insulating layer 282 to contact the source contact 290 for connection to electrical ground within the unit cell. The deeper shielding regions 740 shown in FIG. 7 may more effectively protect the gate insulating layer 282 from premature breakdown, while also maintaining the gap g' in the JFET region 630 to reduce the parasitic resistance.

Figure 8:
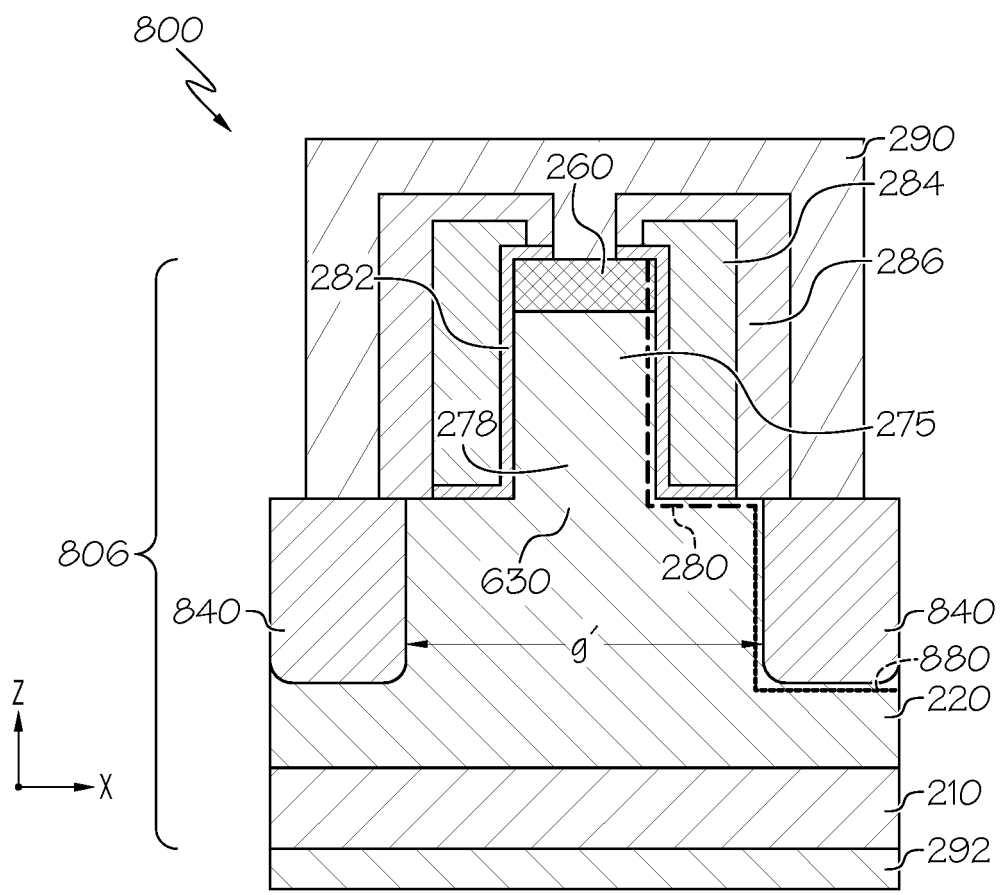
FIG. 8 is a cross-sectional view illustrating a unit cell structure of a power semiconductor device including offset polysilicon shielding regions formed in deep trench regions in accordance with some embodiments of the present invention.

FIG. 8 is a cross-sectional view illustrating a unit cell structure of a power semiconductor device including offset shielding regions in accordance with some embodiments of the present invention. In particular, FIG. 8 illustrates an example reverse operation protection implementation including shielding regions of the second conductivity type that are offset from edges of the gate trenches, provided in secondary trenches that extend deeper (with reference to the substrate) than the gate trenches, and are formed of a different material (e.g., polysilicon) than the wide bandgap semiconductor material of the drift region.

As shown in FIG. 8, an example vertical power semiconductor device, illustrated as a unit cell of a power MOSFET 800, includes a semiconductor layer structure 806. The semiconductor layer structure 806 includes one or more layers similar to the semiconductor layer structure 606. In particular, the semiconductor layer structure 806 includes a substrate 210 and a drift region 220 of a first conductivity type (e.g., n-type). A fin structure 275 protrudes from the drift region 220, and includes a higher dopant concentration (e.g., n⁺) source region 260 and a lower dopant concentration (e.g., n⁻) channel region 278 of the first conductivity type between the source region 260 and the drift region 220, with one or more dimensions and/or doping concentrations such that the channel body 278 is configured to conduct electrical current throughout a majority of (or up to substantially an entirety of) the volume of the fin structure 275 under a bias voltage applied to the drain 292 (in this example without an opposite conductivity type well or channel region in the fin structure 275).

The semiconductor layer structure 806 further includes reverse operation shielding regions 840 of a second conductivity type (e.g., p-type) in the drift region 220, outside of the fin structure 275 and with boundaries offset from sidewalls of the fin structures 275/edges of the gate trenches 280 between adjacent fin structures 275. The shielding regions 840 are separated by a gap g' that is greater than a width of the fin structure 275. In the example of FIG. 8, the shielding regions 840 are formed of a different material than the wide bandgap material of the drift region 220, e.g., a semiconductor material with lower resistance than the wide bandgap material. For example, the drift region 220 may be SiC, and the shielding regions 840 may be polysilicon (poly-Si).

In particular, the finFET device 800 includes secondary trenches 880 (shown by dotted lines) that are formed in bottom surfaces of the gate trenches 280 (shown by dashed lines). The secondary trenches 880 extend toward the substrate 210 to a greater depth than the gate trenches 280. The deeper secondary trenches 880 are offset from the edges of the shallower primary gate trenches 280, and the shielding regions 840 are formed in the secondary trenches 880, e.g., by a deposition process. For example, the secondary trenches 880 may be filled with polysilicon of the second conductivity type, defining poly-Si shielding regions 840 in the SiC drift region 220. The gate insulating layer 282 at the bottom of the gate trenches 280 may be protected by implementing the shielding regions 840 at a certain offset from the trench edges or sidewalls of the gate trenches 280. A poly Si-SiC heterojunction is defined at interfaces between the SiC drift region 220 and the poly-Si shielding regions 840. The polysilicon shielding regions 840 (e.g., p-type poly-Si) may have a bulk resistance that is about 3 orders of magnitude lower than that of SiC shielding regions, such as the shielding regions 640 (e.g., p-type doped SiC), which can allow faster switching and/or improve device reliability and robustness.

Figure 9:
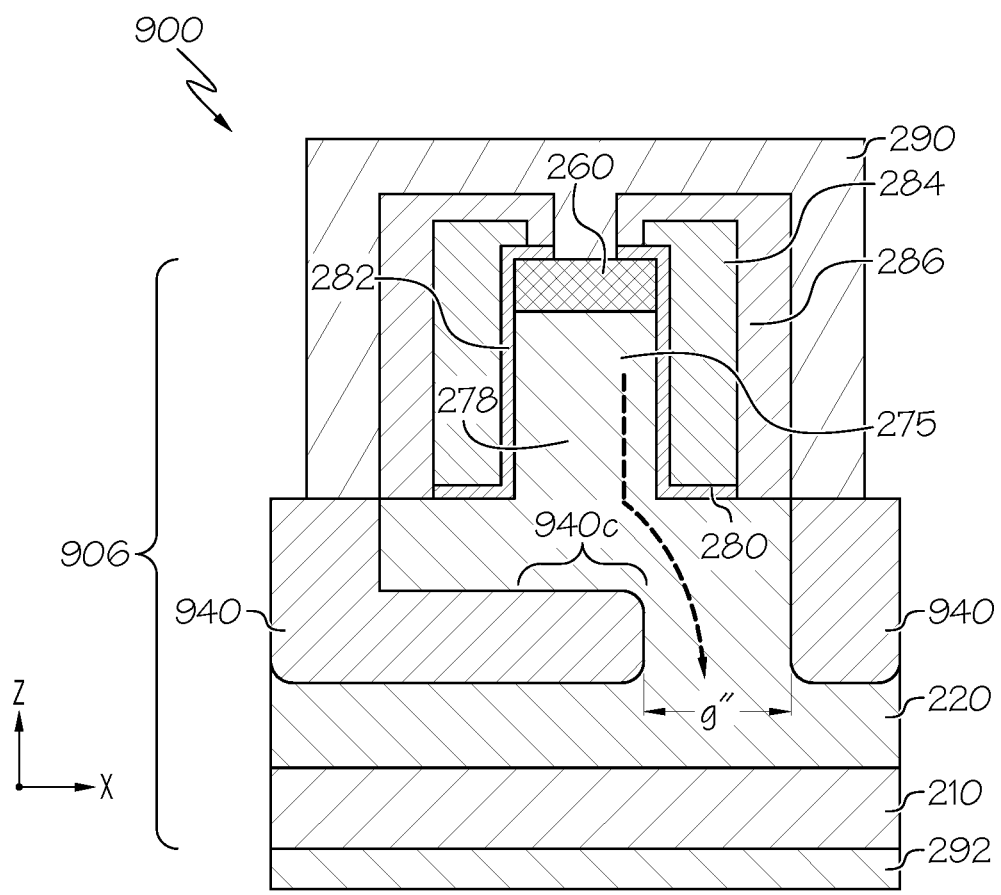
FIG. 9 is a cross-sectional view illustrating a unit cell structure of a power semiconductor device including asymmetric shielding regions in accordance with some embodiments of the present invention.
Figure 10:
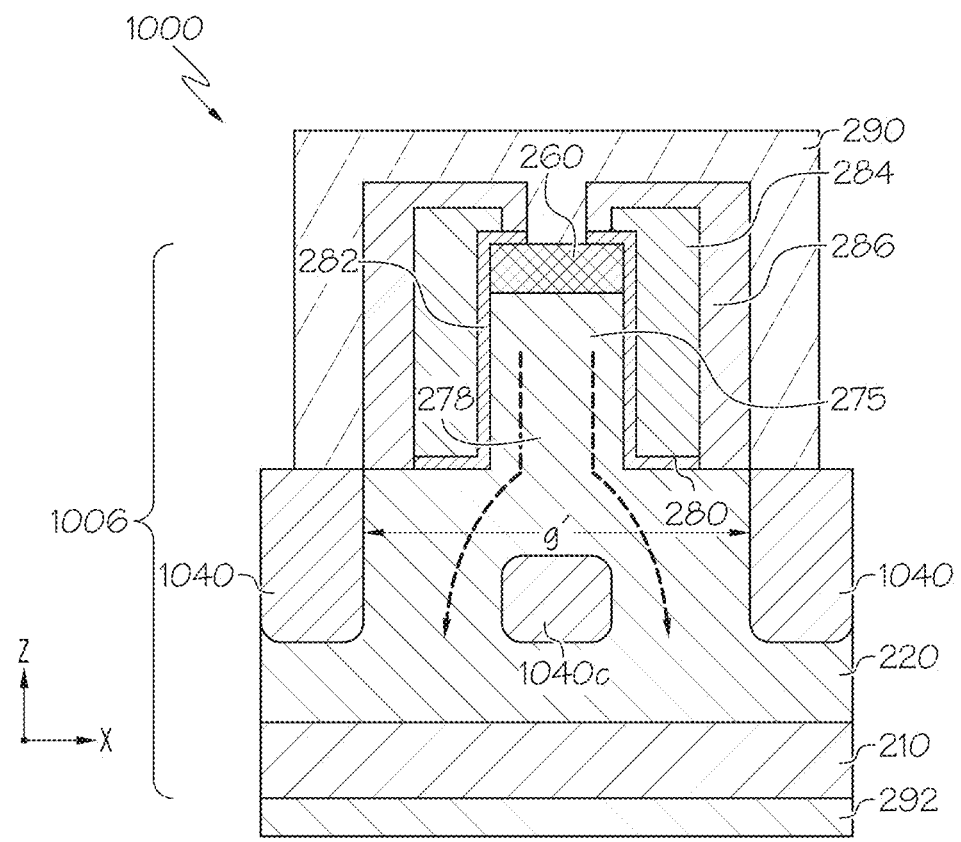
FIG. 10 is a cross-sectional view illustrating a unit cell structure of a power semiconductor device including additional narrower shielding regions in portions of the drift region below the channel region in accordance with some embodiments of the present invention.
Figure 11:
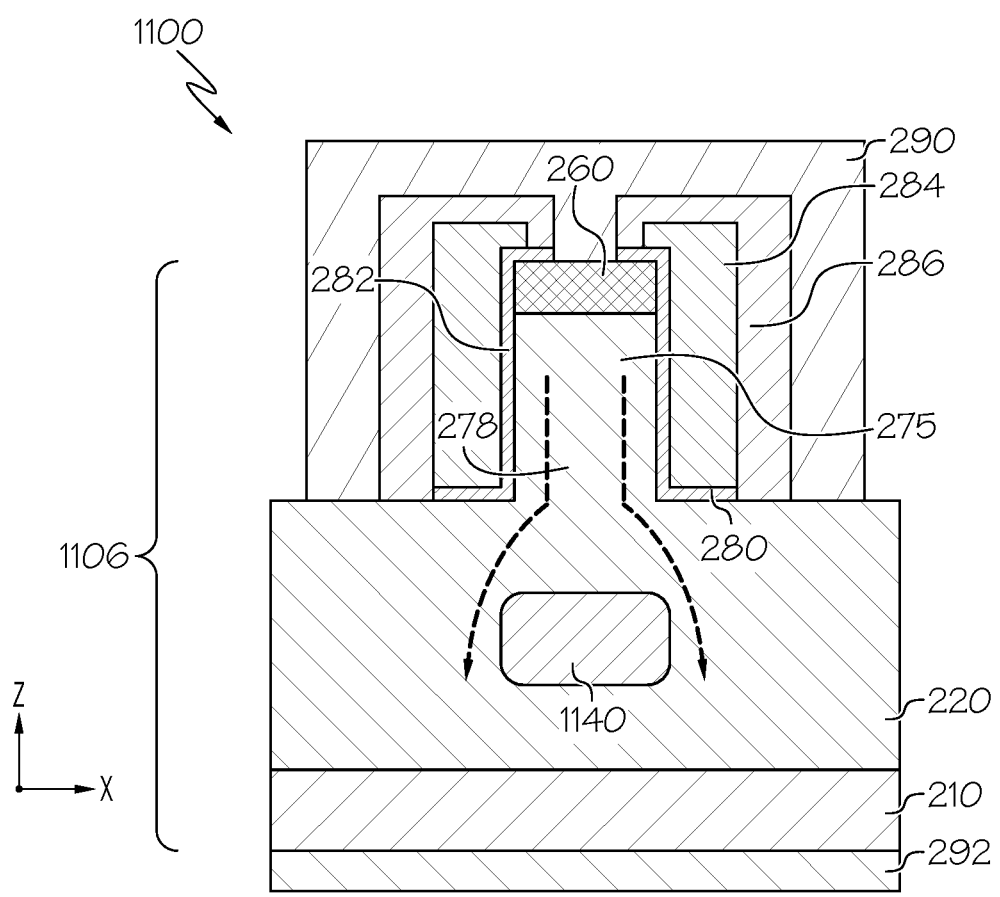
FIG. 11 is a cross-sectional view illustrating a unit cell structure of a power semiconductor device including wider shielding regions in portions of the drift region below the channel region in accordance with some embodiments of the present invention.

FIGS. 9, 10, and 11 illustrate various shielding region implementations according to embodiments of the present invention. In particular, FIG. 9 is a cross-sectional view illustrating a unit cell structure of a power semiconductor device including asymmetric shielding regions, FIG. 10 is a cross-sectional view illustrating a unit cell structure of a power semiconductor device including a narrower shielding region in portions of the drift region below the channel region, and FIG. 11 is a cross-sectional view illustrating a unit cell structure of a power semiconductor device including a wider shielding region in portions of the drift region below the channel region in accordance with some embodiments of the present invention.

As shown in FIGS. 9, 10, and 11, example vertical power semiconductor devices, illustrated as unit cells of power MOSFETs 900, 1000, 1100, include semiconductor layer structures 906, 1006, 1106, respectively. The semiconductor layer structures 906, 1006, 1106 include one or more layers similar to the semiconductor layer structure 606. In particular, the semiconductor layer structures 906, 1006, 1106 each include a substrate 210 and a drift region 220 of a first conductivity type (e.g., n-type). A fin structure 275 protrudes from the drift region 220, and includes a higher dopant concentration (e.g., n⁺) source region 260 and a lower dopant concentration (e.g., n⁻) channel region 278 of the first conductivity type between the source region 260 and the drift region 220, with one or more dimensions and/or doping concentrations such that the channel body 278 is configured to conduct electrical current throughout a majority of (or up to substantially an entirety of) the volume of the fin structure 275 under a bias voltage applied to the drain 292 (in these examples without an opposite conductivity type well or channel region in the fin structure 275).

The semiconductor layer structures 906, 1006, 1106 further include reverse operation shielding regions 940, 1040, 1140 of a second conductivity type (e.g., p-type) in portions of the drift region 220 outside of the fin structure 275 and between the fin structure 275 and the drain region 210. The shielding regions 940 and 1040 of FIGS. 9 and 10 are separated by gaps (illustrated as g" and g', respectively). The gaps (e.g., g, g', g") between shielding regions (e.g., 340-1240) described herein can be narrower, wider, or asymmetric relative to the fin structure 275, and the gaps may or may not correspond to the width or other dimensions of the fin structure 275. That is, the shielding regions can be closer or further apart than shown in the examples described herein, and/or may extend to greater or shallower depths relative to the fin structure 275.

In the device 900 of FIG. 9, the shielding regions 940 are separated by a gap g" that is narrower than a width of the fin structure 275. In the device 1000 of FIG. 10, the shielding regions 1040 are separated by a gap g' that is greater than a width of the fin structure 275. In some embodiments, as shown in FIGS. 9, 10 and 11, a central shielding region 940c, 1040c, 1140 may be provided under the fin structure 275. The central shielding region 940c, 1040c, 1140 may be a buried region at or below a base of the fin structure 275, and may be formed, for example, by ion implantation and with a dopant concentration similar to the peripherally-located shielding regions (e.g., 940, 1040). The central shielding region may be wider than (e.g., as shown by shielding region 1140 in FIG. 11), narrower than (as shown by shielding region 1040c in FIG. 10), or asymmetric relative to (as shown by the laterally extending portion 940c of the left-side shielding region 940, extending along the x-direction in FIG. 9) the fin structure 275. That is, the central shielding region 940c, 1040c, 1140 under the fin structure 275 may or may not correspond to the width or other dimensions of the fin structure 275. In some embodiments, as shown in FIG. 9, the central shielding region 940c may be connected to one or more of the peripheral shield regions 940, for example, in a periodic fashion (e.g., every other shielding region, every two shielding regions, etc.).

The shielding region configurations shown in FIGS. 9, 10, and 11 represent different cross-sections of the fin structures 275 described herein, or more generally may be used in combination with one another and/or with any of the embodiments described herein. For example, respective cross-sections taken along a length of a fin structure 275 (e.g., along the y-direction) may include the shielding region 640 shown in FIG. 6 alternating with the shielding regions 940, 940c of FIG. 9, and in some embodiments with the gap g" between the shielding regions 940 and 940c alternating from the left side of the fin structure 275 (as shown in FIG. 9) to the right side. That is, the cross-sectional views of FIG. 6 and FIG. 9 may alternate along the y-direction of the same fin structure 275. As another example, the cross-sectional views of FIG. 10 and FIG. 9 may alternate along the y-direction of the same fin structure 275, with the central shielding region 1040c of FIG. 10 and the central shielding region 940c of FIG. 9 illustrating respective cross-sections of the same central shielding region that continuously extends along the length of the fin structure 275 in the y-direction, and the peripheral shielding regions 940 providing connections to the central shielding region at portions 940c. That is, the shielding region configurations of the fin structures 275 described herein may not be limited to any one of the cross-sectional views illustrated herein, but rather, may vary along the length of the fin structures 275 (e.g., along the y-direction) in accordance with any combination of the cross-sectional views illustrated herein, for example, to provide connections between central portions and edge portions of the shielding regions.

More generally, the depths and/or dopant concentration of shielding region(s) 340-1240 described herein can be increased or decreased to provide sufficient or desired blocking capability (e.g., depending on the gap between shielding regions). While illustrated with reference to p-n junctions, the shielding region(s) 340-1240 can alternatively be implemented as superjunctions (with alternating deep shielding regions), or as heterojunctions to provide the blocking capability. Also, the shielding region(s) 340-1240 can be formed by implantation into the semiconductor material of the drift region 220 (e.g., p-type dopant implants), or by deposition or growth of a different material (e.g., p-type polysilicon) on or in etched portions of the semiconductor material of the drift region 220.

Figure 12:
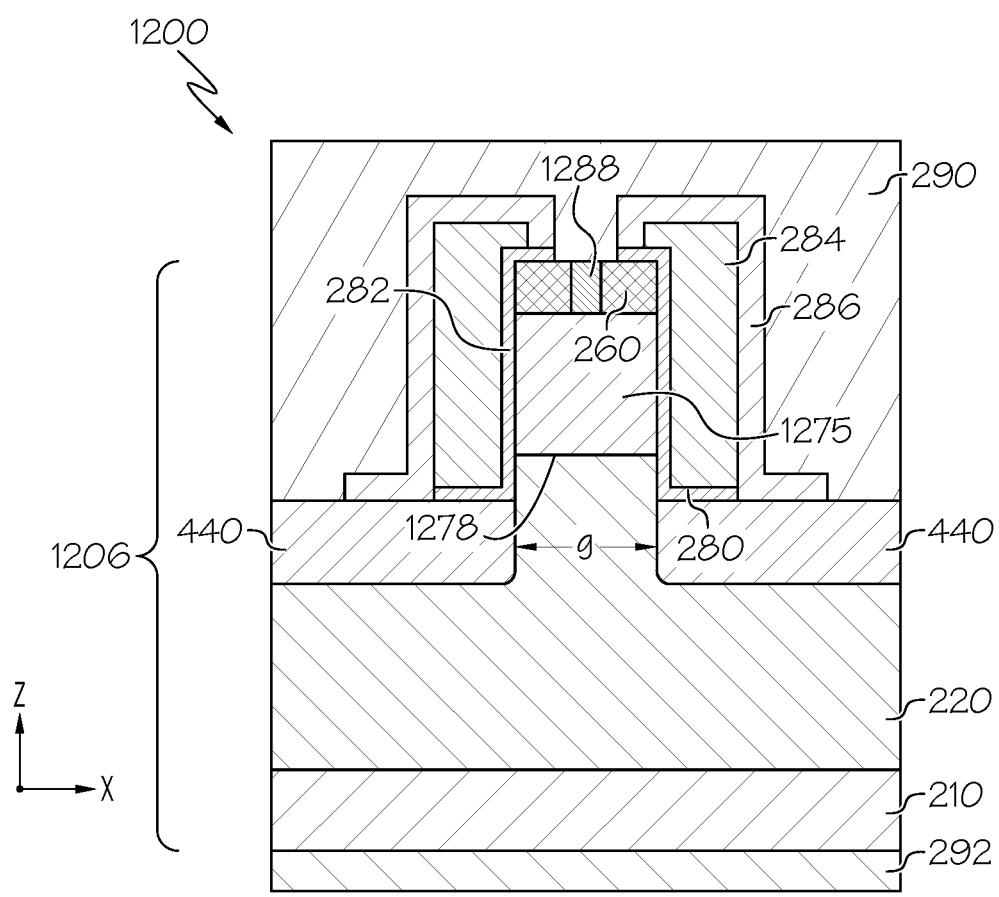
FIG. 12 is a cross-sectional view illustrating a unit cell structure of a power semiconductor device including opposite conductivity type well regions in accordance with some embodiments of the present invention.

FIG. 12 is a cross-sectional view illustrating a unit cell structure of a power semiconductor device including opposite conductivity type well regions in accordance with some embodiments of the present invention. In particular, in contrast to the junction-less devices in some embodiments, FIG. 12 illustrates a finFET device that is configured to provide volumetric current flow with a p-n junction in the fin structure.

As shown in FIG. 12, an example vertical power semiconductor device, illustrated as a unit cell of a power MOSFET 1200, includes a semiconductor layer structure 1206. The semiconductor layer structure 1206 includes a substrate 210 and a drift region 220 of a first conductivity type (e.g., n-type). A fin structure 1275 protrudes from the drift region 220. The fin structure 1275 includes a higher dopant concentration (e.g., $n^+$) source region 260 of the first conductivity type and a lower dopant concentration (e.g., $p^-$) well region 1278 of the second conductivity type between the source region 260 and the drift region 220. The fin structure 1275 thus includes one or more dimensions and/or doping concentrations such that the channel body (resulting from inversion of the well region 1278) is configured to conduct electrical current throughout a majority of (or up to substantially an entirety of) the volume of the fin structure 1275 under a bias voltage applied to the drain 292.

The fin structure 1275 including the well region 1278 of the opposite conductivity type as the drift region 220 may have one or more dimensions (e.g., widths, lengths, and/or heights) similar to the fin structures 275 including junction-less channel regions 278 described herein. The fin structure 1275 may be doped with dopants of the second conductivity type (e.g., p-type impurities), and may have a relatively low dopant concentration of about $1\times10^{14}$ to $1\times10^{17}$ atoms/cm$^3$, for example, about $5\times10^{14}$ to $5\times10^{16}$ atoms/cm$^3$, about $1\times10^{15}$ to $1\times10^{16}$ atoms/cm$^3$, or about $1\times10^{15}$ to $5\times10^{15}$ atoms/cm$^3$, which may vary with the dimensions (e.g., width, height) of the fin structure 1275. The fin structure 1275 defines a channel region 1278 for the MOSFET 1200. As such, the channel region defined in the well region 1278 has a dopant concentration that is of the opposite conductivity type to the drift region 220, and is less than the dopant concentration of the drift region 220, e.g., by a factor of about 10 or more in some embodiments. P-n junctions are defined at the interfaces between portions of the n-type fin structure 1275 and the opposite conductivity type well region 1278 in the fin structure 1275.

As such, the MOSFET 1200 is in an "off"-state in the absence of an applied voltage to the gate 284, and can be turned "on" by applying a sufficient voltage (beyond a threshold voltage) to the gate 284 for inversion of the well region 1278 and conduction between the source region 260 and the drain 292. Based on the dimensions of the fin structure 275 and the dopant concentration of the opposite conductivity type well region 1278 therein, inversion of a majority of (or up to substantially an entirety of) the well region 1278 may be achieved in response to the applied gate voltage, allowing for conduction of electrical current or electron flow throughout a majority of (or up to substantially an entirety of) the respective volumes of the fin structures 1275 under a bias voltage applied to the drain 292. That is, a combination of one or more dimensions of the fin structures 1275 with the dopant concentration of the well region 1278 described herein may be configured to provide carrier distribution or current flow throughout a majority (e.g., more than 50 percent, more than 75 percent, or up to an entirety) of the volume of each fin structure 1275.

Similar to the previous embodiments, the semiconductor layer structure 1206 includes reverse operation shielding regions 440 of a second conductivity type (e.g., p-type) in the drift region 220, under the gate trenches 280 and outside of the fin structure 1275 and between adjacent fin structures 275. In addition, a more heavily doped (e.g., p$^+$) region 1288 of the second conductivity type may be provided between the source regions 260 at the top of the fin structure 1275, in contact with the source contact 290. Shielding connection patterns (not shown) may be electrically connected to the shielding regions 440 (e.g., by the source contacts 290) to allow the shielding regions 440 to be electrically grounded.

It will be understood that the opposite conductivity type well region 1278 illustrated in the example of FIG. 12 may be used replace the junction-less channel region 278 in any of the configurations described herein. That is, while described primarily herein with respect to junction-less channels 278, it will be understood that embodiments of the present invention are not limited to junction-less implementations, but rather, may include any fin structures that are configured to provide volumetric conduction of electrical current.

Figure 13:
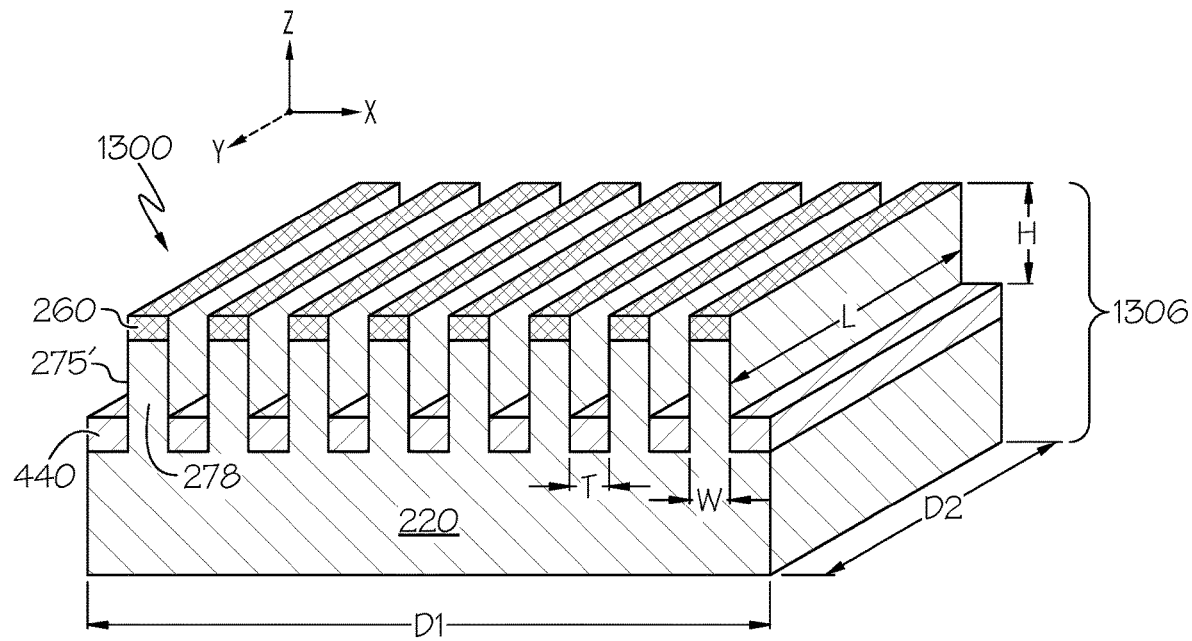
FIG. 13 is a perspective view illustrating a continuous fin structures in a power semiconductor device in accordance with some embodiments of the present invention.
Figure 14:
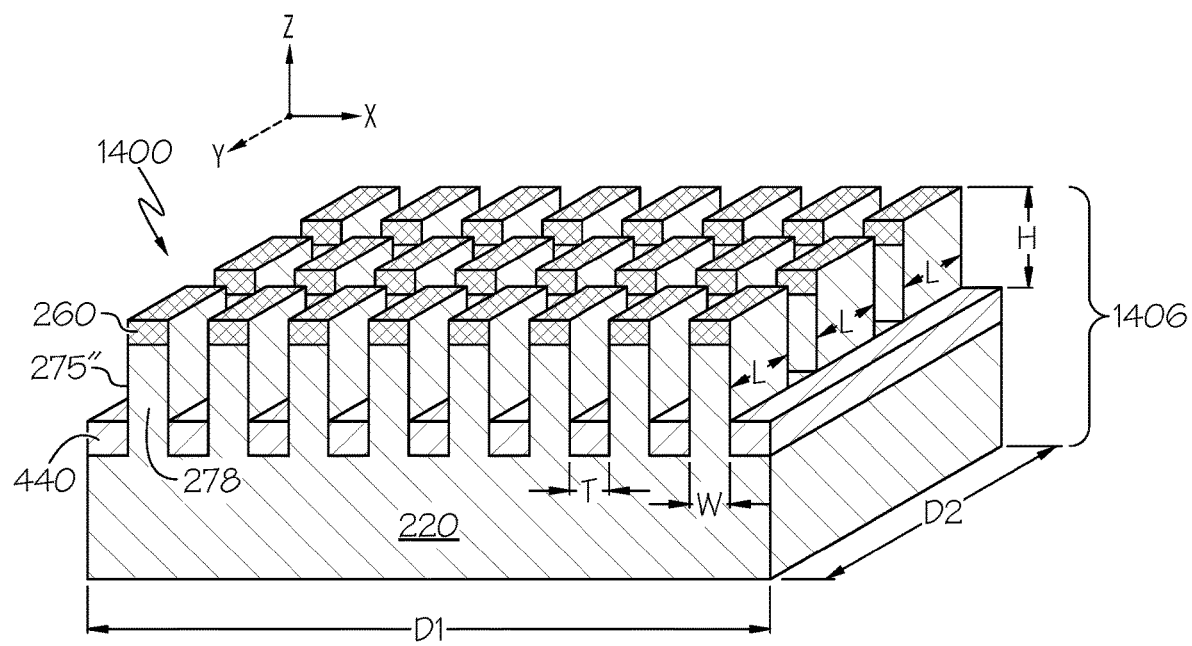
FIG. 14 is a perspective view illustrating island- or pillar-shaped fin structures in a power semiconductor device in accordance with some embodiments of the present invention.

FIG. 13 is a perspective view illustrating continuous fin structures in a power semiconductor device in accordance with some embodiments of the present invention. FIG. 14 is a perspective view illustrating island-shaped fin structures in a power semiconductor device in accordance with some embodiments of the present invention.

As shown in FIGS. 13 and 14, the fin structures 275 described herein may extend continuously (as shown by the stripe-shaped fin structures 275' of FIG. 13) or discontinuously (as shown by the island or pillar-shaped fin structures 275" of FIG. 14) in one or more directions. For example, semiconductor layer structures 1306, 1406 include fin structures 275', 275" that are spaced apart from one another in a first direction (e.g., in the x-illustrated x-direction or width direction W), and continuously or discontinuously extend in a different second direction (e.g., in the illustrated y-direction or length direction L) that is perpendicular to the first direction. The spacings or distances between adjacent fins (e.g., the trench widths T discussed below) may be the same or similar in the first and/or second directions. The fin structures 275, 275', 275" thus protrude from the drift region 220 in a third direction (e.g., in the illustrated z-direction or height direction H), and include respective source regions 260 of the first conductivity type and respective channel regions 278 extending in the vertical or height direction H between the source region 260 and the drift region 220. In other words, the respective source regions 260 are stacked on the respective channel regions 278 opposite the drift region 220. The source contacts (on the source regions 260), the drain contact (on the drift region 220 or underlying substrate opposite the source regions 260), gates, and various other features of the devices 1300 and 1400 are not shown in FIGS. 13 and 14 for ease of illustration of the semiconductor layer structures 1306 and 1406.

In some embodiments, the fin structures 275, 275', 275" may be more closely spaced along the width W and/or length L directions, in order to increase a population density of the fin structures 275, 275', 275" relative to the overall surface area or footprint of the power semiconductor devices 1300, 1400. For example, the trench widths T of the gate trenches between adjacent fin structures 275, 275', 275" may be reduced or minimized in order to increase or maximize the number of fin structures 275, 275', 275" in the devices 1300, 1400. For example, the gate trenches may have respective trench widths T of about 35 nanometers (nm) to about 2.5 micrometers (μm), for example, about 50 nm to about 2 μm, or about 100 nm to about 1 μm. In some embodiments, the trench widths T may be similar to the fin widths W, such that a ratio of the trench widths T to the fin widths W may be about 1:1.

As the fin structures 275, 275', 275" are dimensioned to provide on-state conduction regions with volumetric current flow, increasing the number of fin structures 275, 275', 275" in the devices 1300, 1400 may thereby improve the overall conduction area as compared to some prior devices. In some embodiments, power semiconductor devices as described herein may provide a conduction area (collectively defined by the respective footprints of the fin structures 275, 275', 275") of greater than about 50% or more (e.g., about 60% or more, about 75% or more, or about 100% or more) of the overall surface area or footprint of the devices 1300, 1400 (e.g., the surface area defined by D1×D2). The conduction area of the device may also depend on the heights H of the fin structures 275 (and thus the sidewall surface). For example, if the fin height H (i.e., trench depth) is more than the spacing (i.e., the trench width T) between two fins 275, a conduction area of more than 100% of the surface area defined by D1×D2 can be achieved. The conduction area may be limited based on desired shielding capability or requirements in some embodiments.

Figure 15C:
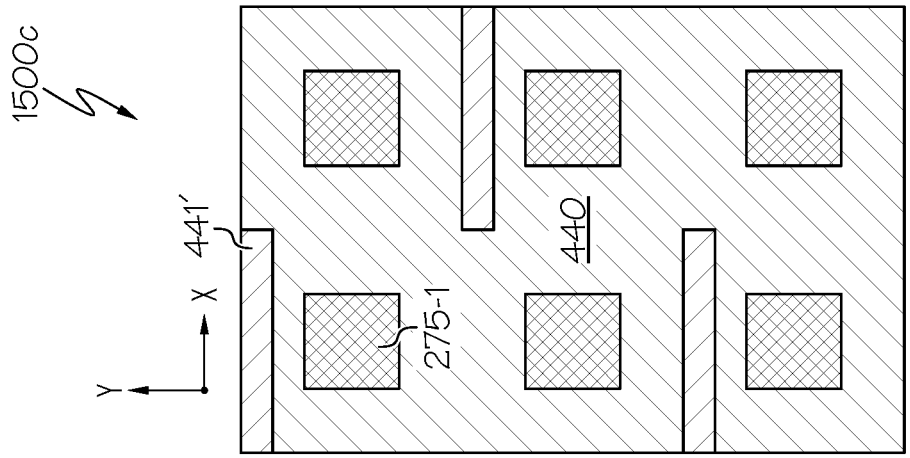
FIGS. 15A, 15B, 15C, 15D, and 15E are a plan views illustrating fin structures in a power semiconductor device including shielding regions and shielding connecting patterns in accordance with some embodiments of the present invention.
Figure 15B:
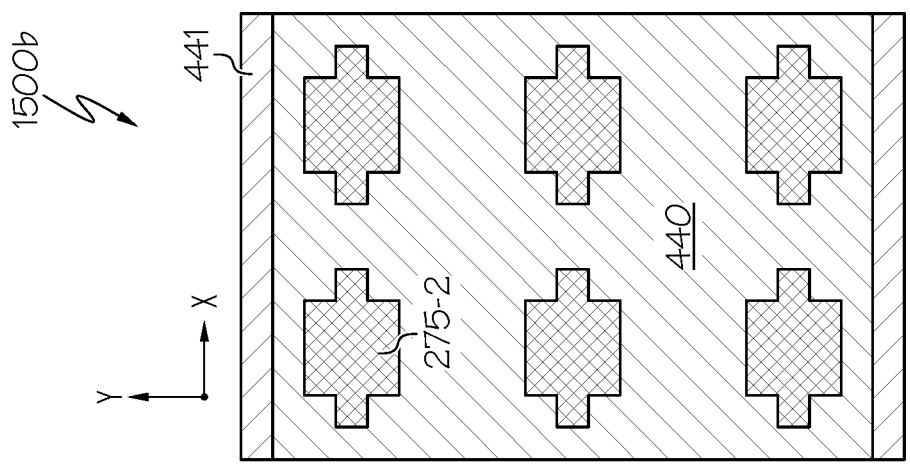
Figure 15A:
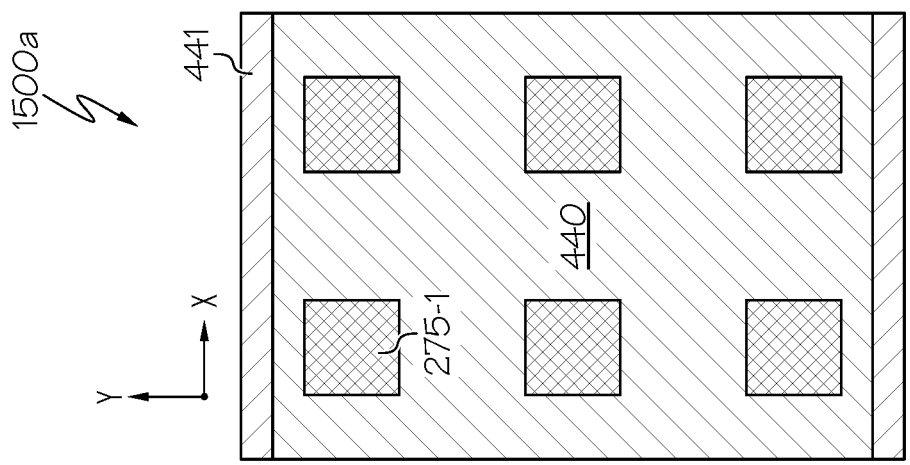
Figure 15E:
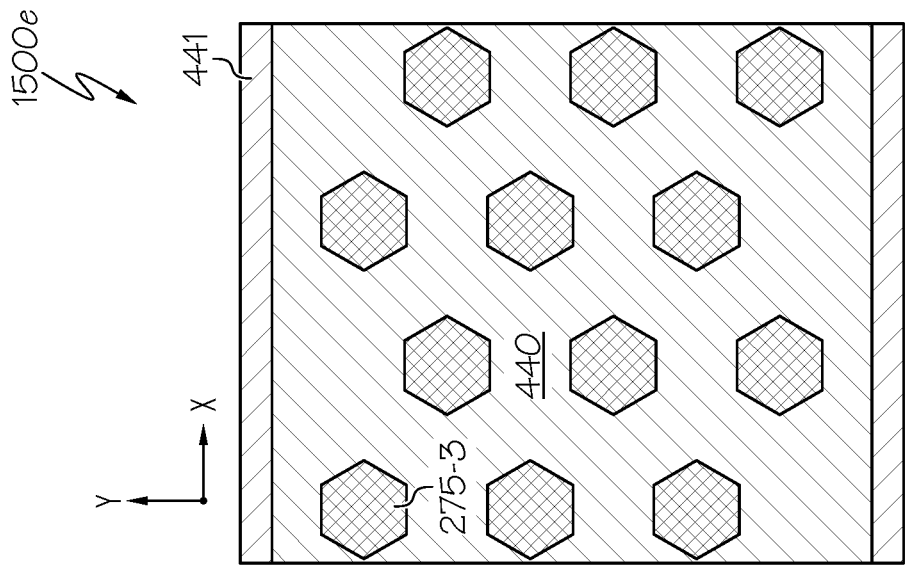
Figure 15D:
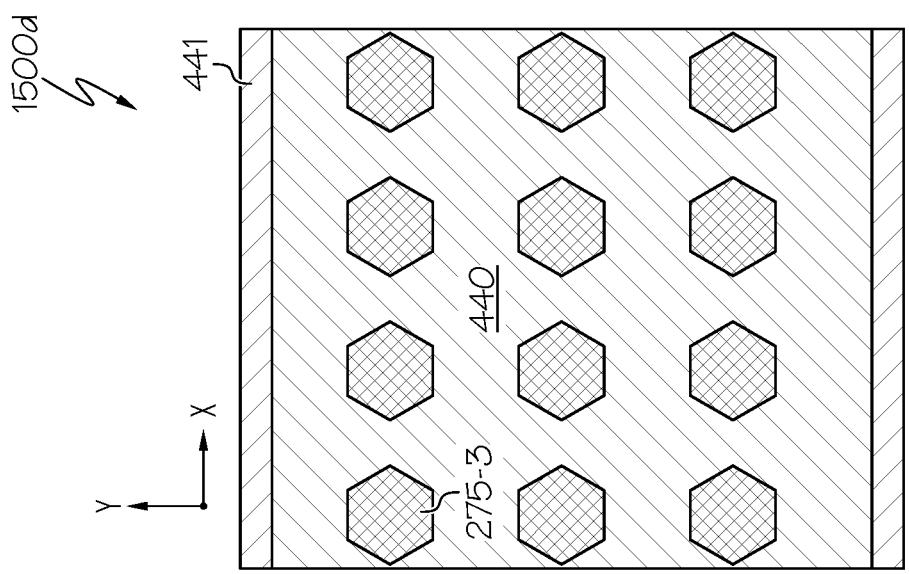

FIG. 15A is a plan view illustrating fin structures in a power semiconductor device 1500*a* including shielding regions and shield connecting patterns in accordance with some embodiments of the present invention. FIGS. 15B, 15D, and 15E are plan views illustrating alternative fin structures in power semiconductor devices 1500*b*, 1500*d*, and 1500*e* in accordance with some embodiments of the present invention. FIG. 15C is a plan view illustrating alternative shielding connecting patterns in a power semiconductor device 1500*c* in accordance with some embodiments of the present invention.

As shown in FIG. 15A to 15E, the fin structures 275-1, 275-2, 275-3 (collectively 275) have island shapes that extend in different first (e.g., x- or width) and second (e.g., y- or length) directions in plan view. In FIGS. 15A and 15C, the fin structures 275-1 have square or rectangular shapes in plan view. In FIG. 15B, the fin structures 275-2 have cross-shapes (e.g., with two or more intersecting portions, each extending in a different direction) in plan view. In FIGS. 15D and 15E, the fin structures 275-3 have hexagonal shapes in plan view. The fin structures 275 may be arranged to collectively define rectangular or square patterns (in FIGS. 15A-15D) or hexagonal patterns (in FIG. 15E) in plan view. More generally, although shown with reference to various shapes in plan view, fins or pillars in accordance with embodiments of the present invention are not limited to the illustrated shapes and may include other shapes (e.g., other polygonal or elliptical shapes, for example circular shapes) or any suitable shapes configured to provide volumetric conduction as described herein.

The shielding connection patterns 441, 441' include heavily-doped regions of the second conductivity type (e.g., p$^+$ regions) that extend in one or more directions in the drift region 220 in plan view. The shielding connection patterns 441, 441' are arranged to allow for electrical connection to the shielding regions 440, which can be provided aligned with (as shown in FIGS. 15A to 15C) or offset from the sidewalls of the fin structures 275, 275". In FIGS. 15A, 15B, 15D, and 15E, the shielding connection patterns 441 continuously extend in one direction (e.g., defining stripe shapes along the width direction of the fin structures 275) on opposite sides of the illustrated subset of fin structures 275. In FIG. 15C, the shielding connection patterns 441' discontinuously extend in one direction (e.g., defining segmented stripes along the width direction of the fin structures 275) between the fin structures 275 of the illustrated subset, but with greater frequency than the shielding connection patterns 441. For example, the shielding connection patterns 441' of FIG. 15C may extend between two adjacent fin structures 275 to contact an underlying central shielding region (e.g., 1040c, 1140).

More generally, the shielding connection patterns 441, 441' may continuously or discontinuously extend in one or more directions so as to provide electrical ground connections for the shielding regions 440. Likewise, while illustrated as continuously extending between the island-shaped fin structures 275 in FIGS. 15A to 15E, the shielding regions 440 (as well as the shielding regions 340-1240 described herein) can extend continuously or discontinuously between fin structures 275, in one or more directions (e.g., along the width and/or length directions of the fins structures 275).

Embodiments described herein may be used in trenched vertical semiconductor power transistors (MOSFET or IGBT). More generally, it will be appreciated that features of the different embodiments disclosed herein may be combined in any way to provide many additional embodiments. Also, while the present invention is described above primarily with respect to power MOSFET implementations, it will be appreciated that the techniques described herein apply equally well to other similar power semiconductor devices requiring high voltage blocking. Thus, embodiments of the present invention are not limited MOSFETs, and the techniques disclosed herein may be used on IGBTs or any other appropriate gate trench device. For example, features of any MOSFET embodiment described herein may be incorporated into IGBT embodiments fabricated on SiC, or other semiconductor materials, for example, Si. Thus, it will be appreciated that various features of the inventive concepts are described herein with respect to specific examples, but that these features may be added to other embodiments and/or used in place of example features of other embodiments to provide many additional embodiments. The present invention should therefore be understood to encompass these different combinations.

In the description above, each example embodiment is described with reference to regions of particular conductivity types. It will be appreciated that opposite conductivity type devices may be formed by simply reversing the conductivity of the n-type and p-type layers in each of the above embodiments. Thus, it will be appreciated that the present invention covers both n-channel and p-channel devices for each different device structure (e.g., MOSFET, IGBT, etc.).

The present invention has primarily been discussed above with respect to silicon carbide based power semiconductor devices. It will be appreciated, however, that silicon carbide is used herein as an example and that the devices discussed herein may be formed in any appropriate wide bandgap semiconductor material system. As an example, gallium nitride based semiconductor materials (e.g., gallium nitride, aluminum gallium nitride, etc.) may be used instead of silicon carbide in any of the embodiments described above. More generally, while discussed with reference to silicon carbide devices, embodiments of the present invention are not so limited, and may have applicability to devices formed using other wide bandgap semiconductor materials, for example, gallium nitride, zinc selenide, or any other II-VI or III-V wide bandgap compound semiconductor materials.

Embodiments of the present invention have been described above with reference to the accompanying drawings, in which embodiments of the invention are shown. It will be appreciated, however, that this invention may, however, be embodied in many different forms and should not be construed as limited to the embodiments set forth above. Rather, these embodiments are provided so that this disclosure will be thorough and complete, and will fully convey the scope of the invention to those skilled in the art. Like numbers refer to like elements throughout.

It will be understood that, although the terms first, second, etc. are used throughout this specification to describe various elements, these elements should not be limited by these terms. These terms are only used to distinguish one element from another. For example, a first element could be termed a second element, and, similarly, a second element could be termed a first element, without departing from the scope of the present invention. The term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "top" or "bottom" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Embodiments of the invention are also described with reference to fabrication operations. It will be appreciated that the steps shown in the fabrication operations need not be performed in the order shown.

Some embodiments of the invention are described with reference to semiconductor layers and/or regions which are characterized as having a conductivity type such as n-type or p-type, which refers to the majority carrier concentration in the layer and/or region. Thus, n-type material has a majority equilibrium concentration of negatively charged electrons, while p-type material has a majority equilibrium concentration of positively charged holes. Some material may be designated with a "+" or "−" (as in n+, n−, p+, p−, n++, n−−, p++, p−−, or the like), to indicate a relatively larger ("+") or smaller ("−") concentration of majority carriers compared to another layer or region. However, such notation does not imply the existence of a particular concentration of majority or minority carriers in a layer or region.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. A power semiconductor device, comprising:
   a semiconductor layer structure comprising a wide bandgap semiconductor material, the semiconductor layer structure including a drift region of a first conductivity type and a plurality of fin structures protruding from the drift region, wherein the drift region comprises a first dopant concentration,
   wherein the fin structures comprise respective source regions of the first conductivity type and respective channel regions between the respective source regions and the drift region, wherein the respective channel regions comprise a second dopant concentration that is less than the first dopant concentration; and
   shielding regions of a second conductivity type in portions of the drift region between the fin structures and a substrate of the semiconductor layer structure.

2. The power semiconductor device of claim 1, wherein the respective source regions comprise a third dopant concentration that is greater than the first and second dopant concentrations.

3. The power semiconductor device of claim 1, wherein the respective channel regions comprise regions of the first conductivity type having the second dopant concentration.

4. The power semiconductor device of claim 1, wherein the respective channel regions comprise well regions of a second conductivity type having the second dopant concentration.

5. The power semiconductor device of claim 1, wherein respective boundaries of the shielding regions are substantially aligned with respective sidewalls of the fin structures.

6. A power semiconductor device, comprising:
   a semiconductor layer structure comprising a wide bandgap semiconductor material, the semiconductor layer structure including a drift region of a first conductivity type and a plurality of fin structures protruding from the drift region, wherein the fin structures comprise respective source regions of the first conductivity type and respective first channel regions between the respective source regions and the drift region;
   shielding regions of a second conductivity type in portions of the drift region between the fin structures and a substrate of the semiconductor layer structure; and
   second channel regions between the shielding regions and a surface of the drift region from which the fin structures protrude.

7. The power semiconductor device of claim 5, further comprising:
   respective buried regions of the first conductivity type in portions of the drift region between the shielding regions, wherein the respective buried regions comprise a higher dopant concentration than the drift region.

8. The power semiconductor device of claim 1, wherein the shielding regions laterally extend between adjacent ones of the fin structures and are connected to an electrical ground between the adjacent ones of the fin structures.

9. A power semiconductor device, comprising:
   a semiconductor layer structure comprising a wide bandgap semiconductor material, the semiconductor layer structure including a drift region of a first conductivity type and a plurality of fin structures protruding from the drift region, wherein the fin structures comprise respective source regions of the first conductivity type and respective channel regions between the respective source regions and the drift region; and
   shielding regions of a second conductivity type in portions of the drift region between the fin structures and a substrate of the semiconductor layer structure, wherein respective boundaries of the shielding regions are offset from respective sidewalls of the fin structures.

10. A power semiconductor device, comprising:
    a semiconductor layer structure comprising a wide bandgap semiconductor material, the semiconductor layer structure including a drift region of a first conductivity type and a plurality of fin structures protruding from the drift region, wherein the fin structures comprise respective source regions of the first conductivity type and respective channel regions between the respective source regions and the drift region;
    shielding regions of a second conductivity type in portions of the drift region between the fin structures and a substrate of the semiconductor layer structure; and
    respective trenches extending into the drift region between the fin structures, wherein the respective trenches are offset from respective sidewalls of the fin structures, and wherein the shielding regions extend along floor surfaces of the respective trenches.

11. A power semiconductor device, comprising:
    a semiconductor layer structure comprising a wide bandgap semiconductor material, the semiconductor layer structure including a drift region of a first conductivity type and a plurality of fin structures protruding from the drift region, wherein the fin structures comprise respective source regions of the first conductivity type and respective channel regions between the respective source regions and the drift region; and
    shielding regions of a second conductivity type in portions of the drift region between the fin structures and a substrate of the semiconductor layer structure, wherein the shielding regions comprise a semiconductor material that is different than the wide bandgap semiconductor material.

12. A power semiconductor device, comprising:
    a semiconductor layer structure comprising a wide bandgap semiconductor material, the semiconductor layer structure including a drift region of a first conductivity type and a plurality of fin structures protruding from the drift region, wherein the fin structures comprise respective source regions of the first conductivity type and respective channel regions between the respective source regions and the drift region; and shielding regions of a second conductivity type in portions of the drift region between the fin structures and a substrate of the semiconductor layer structure, wherein the shielding regions on opposite sides of a respective one of the fin structures are asymmetric.

13. The power semiconductor device of claim 1, wherein the respective channel regions have the first conductivity type and are free of p-n junctions therein.

14. The power semiconductor device of claim 1, wherein the fin structures are separated from one another along a first direction, and wherein the fin structures comprise respective widths of about 50 nanometers (nm) to about 200 nm in the first direction.

15. The power semiconductor device of claim 1, further comprising:
gate structures on at least one sidewall of the fin structures, respectively,
wherein the respective channel regions are configured to conduct electrical current between the respective source regions and the drift region throughout a majority of respective volumes of the fin structures responsive to a voltage applied to the gate structures.

16. The power semiconductor device of claim 1, wherein the fin structures protrude from a surface of the semiconductor layer structure, and wherein the fin structures are separated from one another along first and second directions along the surface.

17. A power semiconductor device, comprising:
a semiconductor layer structure comprising a wide bandgap semiconductor material, the semiconductor layer structure including a drift region of a first conductivity type and a plurality of fin structures protruding from the drift region, wherein the fin structures comprise respective source regions of the first conductivity type and respective channel regions between the respective source regions and the drift region; and
gate structures on at least one sidewall of the fin structures, respectively,
wherein the respective channel regions are configured to conduct electrical current between the respective source regions and the drift region throughout a majority of respective volumes of the fin structures responsive to a voltage applied to the gate structures.

18. The power semiconductor device of claim 17, wherein the respective channel regions comprise a second dopant concentration that is less than a first dopant concentration of the drift region, and wherein the respective channel regions are configured to conduct the electrical current throughout substantially an entirety of the respective volumes of the fin structures.

19. A power semiconductor device, comprising:
a semiconductor layer structure comprising a wide bandgap semiconductor material, the semiconductor layer structure including a drift region of a first conductivity type and a plurality of fin structures protruding from a surface of the semiconductor layer structure,
wherein the fin structures comprise respective source regions of the first conductivity type and respective channel regions between the respective source regions and the drift region, and wherein the fin structures are separated from one another along first and second directions along the surface,
wherein the respective channel regions are configured to conduct electrical current between the respective source regions and the drift region throughout a majority of respective volumes of the fin structures.

20. The power semiconductor device of claim 19, further comprising:
gate structures on at least one sidewall of the fin structures, respectively,
wherein the respective channel regions are configured to conduct the electrical current between the respective source regions and the drift region throughout the majority of respective volumes of the fin structures responsive to a voltage applied to the gate structures.

21. The power semiconductor device of claim 19, wherein the first direction is substantially perpendicular to the second direction, and wherein the fin structures have respective widths along the first direction and respective lengths along the second direction.

22. The power semiconductor device of claim 20, wherein the gate structures extend on top surfaces of the fin structures, respectively.

23. The power semiconductor device of claim 20, further comprising:
shielding regions of a second conductivity type in portions of the drift region between the fin structures and a substrate of the semiconductor layer structure.

24. The power semiconductor device of claim 17, wherein the gate structures extend along an entirety of the at least one sidewall of the fin structures, respectively.

25. A power semiconductor device, comprising:
a semiconductor layer structure comprising a wide bandgap semiconductor material, the semiconductor layer structure including a drift region of a first conductivity type and a plurality of fin structures protruding from the drift region, wherein the fin structures comprise respective source regions of the first conductivity type and respective channel regions between the respective source regions and the drift region;
respective multi-level trenches extending into the drift region between the fin structures, wherein the respective multi-level trenches comprise first floor surfaces from which respective sidewalls of the fin structures protrude, and second floor surfaces that are further from the respective source regions of the fin structures than the first floor surfaces; and
shielding regions of a second conductivity type extending along the second floor surfaces between the fin structures.

26. The power semiconductor device of claim 25, further comprising:
gate structures extending along the first floor surfaces of the respective multi-level trenches, wherein the gate structures extend along an entirety of at least one of the respective sidewalls of the fin structures, respectively.

* * * * *